United States Patent
Yabuuchi

(10) Patent No.: US 11,526,329 B2
(45) Date of Patent: Dec. 13, 2022

(54) SEMICONDUCTOR DEVICE

(71) Applicant: RENESAS ELECTRONICS CORPORATION, Tokyo (JP)

(72) Inventor: Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 328 days.

(21) Appl. No.: 16/782,777

(22) Filed: Feb. 5, 2020

(65) Prior Publication Data

US 2020/0257501 A1    Aug. 13, 2020

(30) Foreign Application Priority Data

Feb. 7, 2019  (JP) .............................. JP2019-020844

(51) Int. Cl.
| | | |
|---|---|---|
| G06F 7/00 | (2006.01) | |
| G11C 11/41 | (2006.01) | |
| G06F 7/544 | (2006.01) | |
| G11C 11/418 | (2006.01) | |
| G11C 11/419 | (2006.01) | |
| H01L 23/528 | (2006.01) | |
| H01L 27/11 | (2006.01) | |

(52) U.S. Cl.
CPC .......... *G06F 7/5443* (2013.01); *G11C 11/418* (2013.01); *G11C 11/419* (2013.01); *H01L 23/528* (2013.01); *H01L 27/1104* (2013.01)

(58) Field of Classification Search
None
See application file for complete search history.

(56) References Cited

U.S. PATENT DOCUMENTS

| | | | |
|---|---|---|---|
| 10,777,259 B1 * | 9/2020 | Wang ...................... G11C 11/54 |
| 2005/0276086 A1 | 12/2005 | Perry et al. |
| 2007/0058407 A1 | 3/2007 | Dosaka et al. |
| 2010/0172190 A1 * | 7/2010 | Lavi ......................... G11C 7/02 365/207 |
| 2018/0068708 A1 | 3/2018 | Nii |
| 2020/0301668 A1 * | 9/2020 | Li ........................... G11C 11/54 |
| 2020/0303003 A1 * | 9/2020 | Yanagisawa ....... G11C 13/0061 |

(Continued)

FOREIGN PATENT DOCUMENTS

| | | |
|---|---|---|
| JP | 2007-080314 A | 3/2007 |
| JP | 2018-045753 A | 3/2018 |
| WO | 2005/119694 A1 | 12/2005 |

OTHER PUBLICATIONS

H. Valavi et al., "A Mixed-Signal Binarized Convolutional-Neural-Network Accelerator Integrating Dense Weight Storage and Multiplication for Reduced Data Movement", 2018 Symposium on VLSI Circuits Digest of Technical Papers, IEEE, Jun. 18, 2018, pp. 141-142.

(Continued)

*Primary Examiner* — Tan T. Nguyen
(74) *Attorney, Agent, or Firm* — McDermott Will & Emery LLP

(57) ABSTRACT

A semiconductor device that can reduce power consumption while improving the accuracy of learning and inference is provided. The semiconductor device is connected to data lines PBL, NBL, and comprises a product operation memory cell 1 for storing data of ternary value and performing a product-sum operation between a stored data and an input data INP and a data in the data lines PBL, NBL.

16 Claims, 29 Drawing Sheets

(56) References Cited

U.S. PATENT DOCUMENTS

| | | | |
|---|---|---|---|
| 2021/0089272 A1* | 3/2021 | Jain | G06F 7/5443 |
| 2021/0134343 A1* | 5/2021 | Li | G11C 11/419 |
| 2021/0218414 A1* | 7/2021 | Malhotra | G06N 5/046 |
| 2022/0076737 A1* | 3/2022 | Cosemans | G06N 20/00 |

OTHER PUBLICATIONS

Extended European Search Report issued in corresponding European Patent Application No. 20153666.1-1203, dated Jul. 22, 2020.

Ping Chi et al., "PRIME: A Novel Processing-in-Memory Architecture for Neural Network Computation in ReRAM-based Main Memory", ACM Sigarch Computer Architecture News, Acm Special Interest Group on Computer Architecture, vol. 44, No. 3, Jun. 18, 2016, pp. 27-39.

Pawan Gogna, "Multi-State Memory and Logic Designs Using Multi-Quantum Channel Nano-FETs", Doctoral Dissertations, University of Connecticut, May 11, 2013. pp. 1-121.

Khoa Van Pham et al., "Memristor Binarized Neural Networks", Journal of Semiconductor Technology and Science, vol. 18, No. 5, Oct. 31, 2018, pp. 568-577.

Japanese Notice of Reasons for Refusal issued in corresponding Japanese Patent Application No. 2019-020844, dated Jun. 28, 2022, with English translation.

* cited by examiner

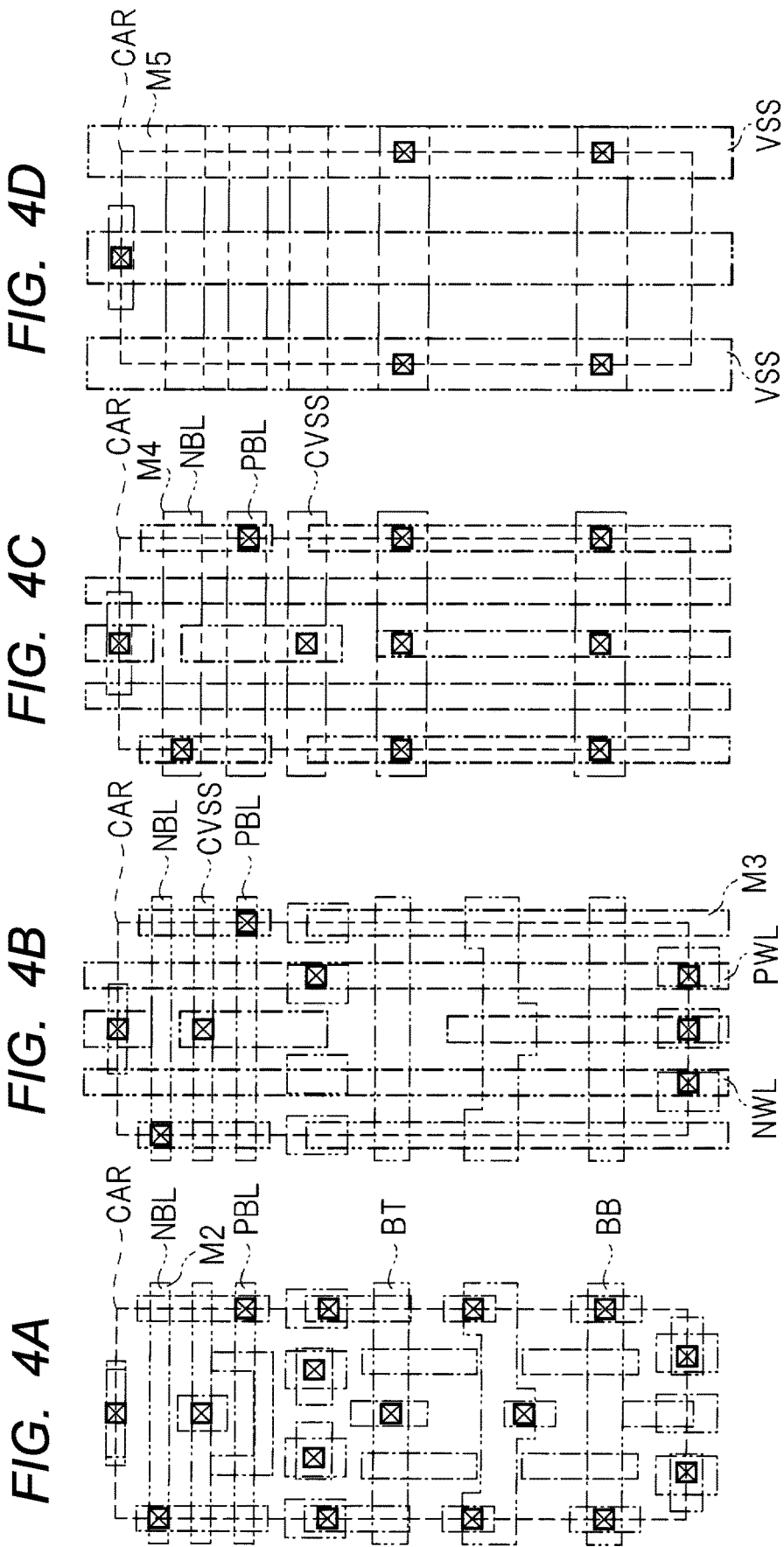

FIG. 5A
FIG. 5B
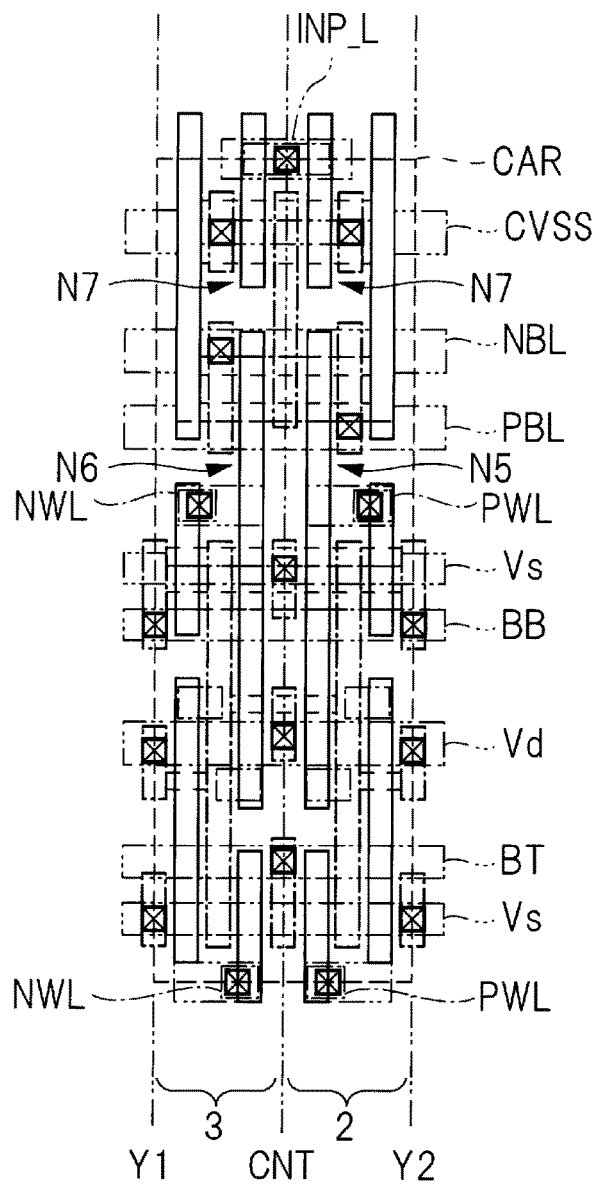
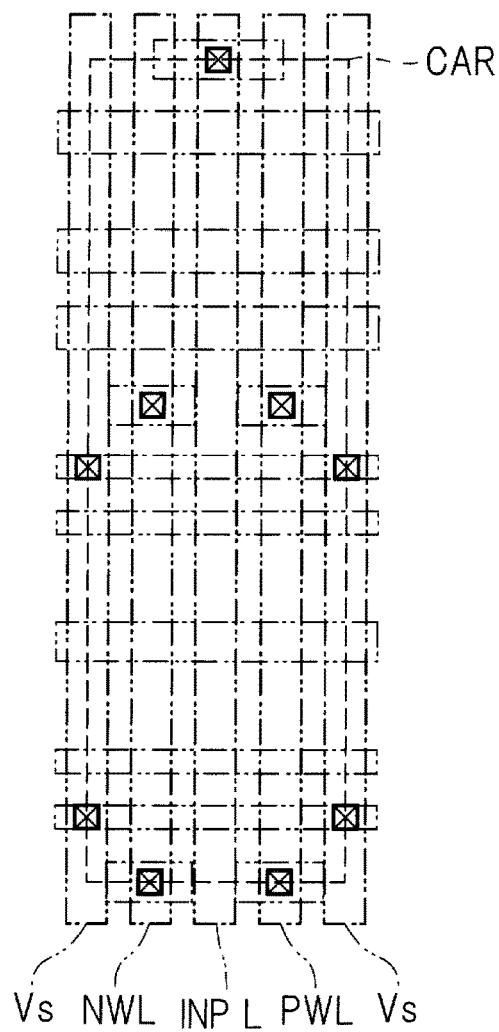

MAXIMUM RESOLUTION 8 BITS

DATA LENGTH 6 BITS

FIG. 18D

EXAMPLES OF OUTPUT VALUE "38"

| OUTPUT DATA LENGTH | CONDITION 1 | | CONDITION 2 | |
|---|---|---|---|---|
| 2bit | +1 | 01 | +0 | 00 |
| 3bit | +3 | 011 | +1 | 001 |
| 4bit | +7 | 0111 | +2 | 0010 |
| 5bit | +15 | 01111 | +4 | 00100 |
| 6bit | +31 | 011111 | +9 | 001001 |
| 7bit | +38 | 0100110 | +19 | 0010011 |
| 8bit | +38 | 00100110 | +38 | 00100110 |

DATA LENGTH 8 BITS

DATA LENGTH 7 BITS

FIG. 22

INPUT/OUTPUT

| NAME OF OUTPUT TERMINAL | NUMBER | I/O | FUNCTION |
|---|---|---|---|
| MACE | 1 | I | PRODUCT-SUM OPERATION ENABLE SIGNAL (ACTIVE HIGH) |
| RST | 1 | I | RESET SIGNAL (ACTIVE HIGH) |
| YA | 2 | I | COLUMN ADDRESS |
| D | 32 | I | INPUT DATA |
| MEN | 32 | I | PRODUCT-SUM OPERATION MASK SIGNAL (ACTIVE LOW) |
| Q | 32 | O | OUTPUT DATA |
| MQ | 32 | O | PRODUCT-SUM OPERATION OUTPUT DATA |

SEMICONDUCTOR DEVICE

CROSS-REFERENCE TO RELATED APPLICATIONS

The disclosure of Japanese Patent Application No. 2019-020844 filed on Feb. 7, 2019 including the specification, drawings and abstract is incorporated herein by reference in its entirety.

BACKGROUND

The present disclosure relates to a semiconductor device. For example, the present invention relates to a semiconductor device which is required to execute a large amount of product-sum operation such as AI (Artificial Intelligence). In recent years, with the development of machine learning by deep learning, AI is being applied in various places. However, this method requires a large amount of product-sum operation, so that the product-sum operation process is accelerated by, for example, a GPU (Graphics Processing Unit) or the like. In addition to the product-sum operation processing, a large amount of data-transfer processing occurs concomitantly with the data-transfer processing. In order to perform these processes, there arises a problem that the power consumption becomes very large.

If this problem can be solved, AI can be used in sensor-side systems as edges in IoT (Internet of Things) or the like, and AI can be used more variously.

As a technique for reducing a data transfer process that is generated in association with the product-sum operation, there is a technique described in "A Mixed-Signal Binarized Convolutional-Neural-Network Accelerator Integrating Dense Weight Storage and Multiplication for Reduced Data Movement", VLSI circuit 2018, Jun. 18, 2018. (Non-Patent Document 1).

SUMMARY

In the Non-Patent Document 1, in order to reduce the data-transfer process, a multiplier in a product operation is stored in a memory cell of a static volatile memory (hereinafter referred to as "SRAM"). In addition, in the Non-Patent Document 1, both of the multiplier and a multiplicand in product operation are represented by binary values of "0" and "1", and the binary values are defined as "−1" and "1" in order to achieve low power dissipation. Thus, the result of the negative exclusive OR (XNOR) is multiplied by "−1" and "1". Furthermore, in the Non-Patent Document 1, by connecting a plurality of memory cells to a data line, a sum of product operations in the respective memory cells is observed as a voltage of the data line. As a result, the number of times of the data transfer process related to the multiplier is reduced in the product operation part of the product-sum operation, and the part of the sum operation is realized by one reading from the data line of the plurality of memory cells.

However, when considering a multi-bit product-sum operation such as a floating point, for example, if the multi-bit is binary, there is a problem that the accuracy of machine-learning and inference is deteriorated due to excessive compression. In addition, a problem arises that the time required for learning and the like becomes enormous.

Other objects and novel features will become apparent from the description of this specification and the accompanying drawings. The semiconductor device according to one embodiment is as follows.

That is, the semiconductor device comprises a memory cell connected to a data line, storing data of ternary value, and performing a product-sum operation of a stored data, an input data input to the memory cell, and a data on the data line. The ternary value is, for example, +1, 0, and −1. According to one embodiment, it is possible to provide a semiconductor device capable of reducing power consumption while improving the accuracy of learning and inference.

BRIEF DESCRIPTION OF THE DRAWINGS

FIG. 4A-4D are diagrams showing layouts of a semiconductor device related to the second embodiment.

FIGS. 5A and 5B are plan views showing layouts of a semiconductor device related to a third embodiment.

FIG. 18A-18D are diagrams for explaining A/D conversion according to an eleventh embodiment.

FIG. 22 is a diagram showing an external terminal included in a semiconductor device according to the first through twelfth embodiments.

DETAILED DESCRIPTION

Hereinafter, each of the embodiments of the present invention will be described below with reference to the drawings. It is to be noted that the disclosure is merely an example, and those skilled in the art can easily conceive of appropriate changes while maintaining the gist of the invention are naturally included in the scope of the invention. In addition, although the drawings may schematically represent the width, thickness, shape, and the like of each portion as compared with actual embodiments for the sake of clarity of description, the drawings are merely an example and do not limit the interpretation of the present invention.

In this specification and the drawings, the same sign is attached to the same elements as those described above with reference to the above-mentioned drawings, and detailed descriptions thereof may be omitted as appropriate.

First Embodiment

<Configuration of a Memory Cell with Product-Sum Operation Function>

Figure 1:
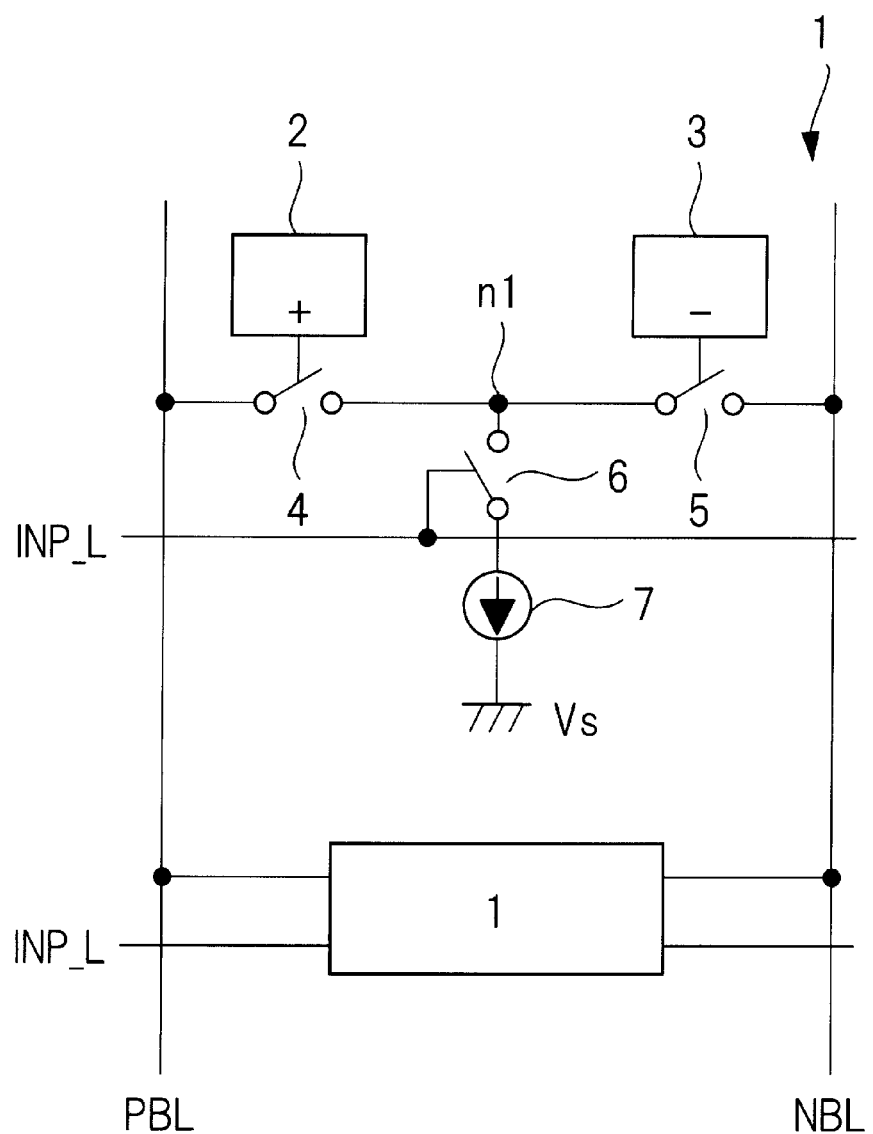
FIG. 1 is a diagram showing a configuration of a memory cell with product-sum operation function related to a first embodiment.

FIG. 1 is a diagram showing a configuration of a memory cell with product-sum operation function (hereinafter referred to as a product operation memory cell) according to the first embodiment. FIG. 1 illustrates two product operation memory cells connected to data lines (a first data line and a second data line) PBL, NBL. Since a product operation memory cell 1 has the same configuration as each other, only one product operation memory cell 1 is shown in FIG. 1. The product operation memory cell 1 comprises two memory cells (first memory cell and second memory cell) 2 and 3 for storing ternary values. In addition to the memory cells 2 and 3, the product operation memory cell 1 includes three switches (first to third switches) 4 to 6 and a constant current source 7.

Memory cells 2 and 3 are memory cells of SRAM and connected to a pair of complementary data lines and word lines described later in FIG. 2, and a logical value is written to memory cells 2 and 3 using the pair of complementary data lines and the word line. Switches 4 and 5 correspond to the memory cells 2 and 3, and are turned to an on state when, for example, a logical value "1" is stored in the corresponding memory cell. The switch 4 is connected between a node n1 and a data line PBL, and the switch 5 is connected between the node n1 and a data line NBL. The switch 6 is connected between the node n1 and the constant current source 7, and the constant current source 7 is connected to a ground voltage Vs. The switch 6 corresponds to an input data INP supplied to an input wiring INP_L, and the switch 6 is turned to the on state when the input data INP is, for example, a logical value "1".

When both of the memory cells 2 and 3 store a logical value "0", the product operation memory cell 1 is regarded to store a logical value "0". When memory cell 2 stores the logical value "1" and the memory cell 3 stores the logical value "0", the product operation memory cell 1 is regarded to store the logical value "+1". Further, when the memory cell 2 stores the logical value "0" and the memory cell 3 stores the logical value "1", the product operation memory cell 1 is regarded to store the logical value "−1".

As a result, when the logical value "0" is stored in the product operation memory cell 1, switches 4 and 5 are turned to an off state, and no current flows from data lines PBL, NBL to the constant current source 7 even if the input data INP is the logical value "1".

On the other hand, when the logical value "+1" is stored in the product operation memory cell 1, the switch 4 is turned to the on state and the switch 5 is turned to the off state. At this time, if the input data INP is the logical value "1", a current flows from the data line PBL to the constant current source 7 via the switches 4 and 6 in a on state, and a voltage of the data line PBL decreases. At this time, a voltage of the data line NBL is not lowered. On the other hand, at this time, if the input data INP is the logical value "0", the switch 6 in the on state is turned to the off state, so that no current flows from the data lines PBL, NBL to the constant current source 7, and the voltages of the data lines PBL and NBL are not lowered.

When the logical value "−1" is stored in the product operation memory cell 1, the switch 5 is turned to the on state and the switch 4 is turned to the off state. At this time, if the input data INP is the logical value "1", a current flows from the data line NBL to the constant current source 7 via the switches 5 and 6 in the on state, the voltage of the data line NBL decreases, and the voltage of the data line PBL does not decrease. On the other hand, at this time, if the input data INP is logical value "0", the switch 6 in the on state is turned to the off state, so that no current flows from the data line PBL, NBL to the constant current source 7, and the voltages of the data lines PBL and NBL are not lowered.

It can be considered that memory cell 2 is used to store the logical value "+1" in the product operation memory cell 1 and the memory cell 3 is used to store the logical value "−1" in the product operation memory cell 1.

As a result, a product operation is executed between the ternary value stored in the product operation memory cell 1 and the value of the input data INP. In other words, six states of 0×0, 0×(+1), 0×(−1), 1×0, 1×(+1), and 1×(−1) are formed in accordance with the logical value of the input data and the logical value of the product operation memory cell. In this case, the product operation is executed between the logical value of the input data and the logical value stored in the product operation memory cell 1, and when the result of the product operation is logical value "1", a current flows between the data line PBL and the constant current source 7, and the voltage of the data line PBL is lowered. On the other hand, when the result of the product operation is the logical value "−1", a current flows between the data line NBL and the constant current source 7, and the voltage of the data line NBL is lowered.

In FIG. 1, the product operation memory cell 1 shown at the lower side of the page operates in a similar manner to perform the product operation between the ternary logical value stored in the product operation memory cell 1 and the logical value of the input data INP, and draw a current from the data line PBL, PBL according to the result of the product operation.

In each of the data lines PBL, NBL, a current according to the product operation result of the product operation memory cell 1 shown on the upper side of the paper and a current according to the product operation result of product operation memory cell 1 shown on the lower side of the paper are superimposed, and a current and a voltage are determined in each of the data lines PBL, NBL. That is, a sum operation is performed so that the products obtained in the two product operation memory cells 1 are summed by the data lines PBL, NBL. The result of the product-sum operation, which is the result of the sum operation, is outputted through the data lines PBL, NBL.

Figure 2:
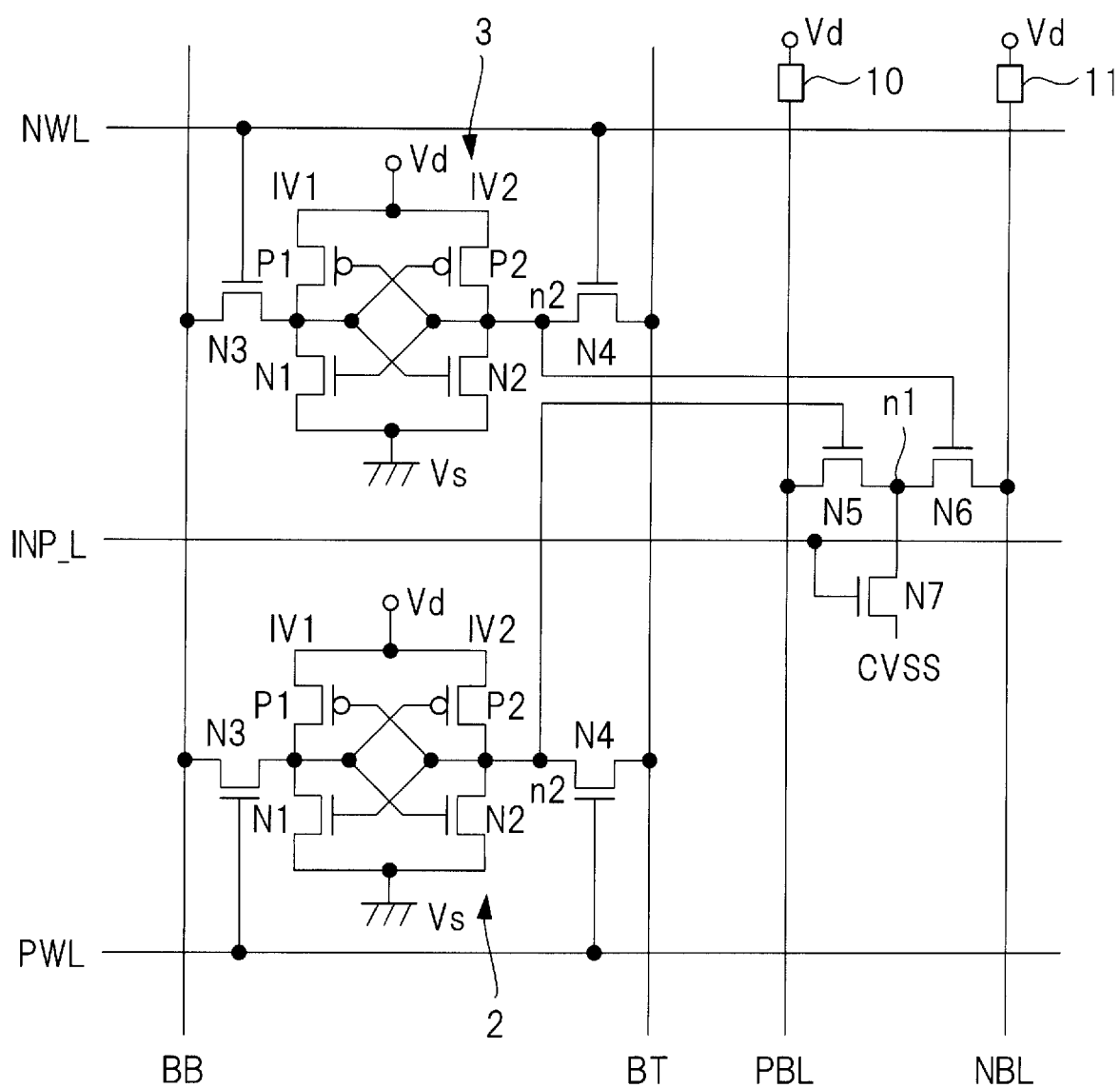
FIG. 2 is a schematic diagram showing a configuration of a product operation memory cell related to the first embodiment.

FIG. 2 is a schematic diagram showing a configuration of the product operation memory cell related to the first embodiment. FIG. 2 shows only one product operation memory cell of the two product operation memory cells 1 shown in FIG. 1. The configuration of the memory cell will be described by exemplifying the memory cell 2. The memory cell 2 is a memory cell of a so-called SRAM comprised of six transistors. That is, the memory cell 2 is comprised of a plurality of P-channel field effect transistors (referred to as P-type FET) and a plurality of N-channel field effect transistors (referred to as N-type FET). In FIG. 2 and the drawings to be described later, the P-type FET is distinguished from the N-type FET by marking the gate electrode with a circle. When a channel type is not distinguished, a field effect transistor is hereinafter referred to as a FET.

The memory cell 2 includes a first inverter circuit IV1 comprised of a P-type FET P1 and an N-type FET N1, and a second inverter circuit IV2 comprised of a P-type FET P2 and an N-type FET N2. The first inverter circuit IV1 and the second inverter circuit IV2 are connected between the power supply voltage Vd and the ground voltage Vs. An input of the first inverter circuit IV1 is connected to an output of the second inverter circuit IV2, and an input of the second inverter circuit IV2 is connected to an output of the first inverter circuit IV1. That is, the first inverter circuit IV1 and the second inverter circuit IV2 are cross-connected so as to constitute a latch circuit. Transfer N-type FETs N3 and N4 are connected between the inputs of the second inverter circuit IV2 and the first inverter circuit IV1 and the pair of complementary data lines BB and BT. The gate electrodes of the transfer N-type FETs N3 and N4 are connected to a word line PWL.

A pair of complementary data lines BB, BT and the word lines PWL are used when writing data to the memory cell 2. That is, when data is written to the memory cell 2, complementary voltages (a high level and a low level) according to the logical value of the data to be written are supplied to the complementary data lines BB and BT, and the high level is supplied to the word line PWL. As a result, complementary voltages in the pair of complementary data lines BB and BT are supplied to the latch circuit formed by the first inverter circuit IV1 and the second inverter circuit IV2 via the transfer N-type FETs N3 and N4, and the logical value "0" or "1" is written to the memory cell 2. The logical value held in the memory cell 2 is outputted from the node n2.

The memory cell 3 has the same configuration as the configuration of the memory cell 2, but the gate electrode of the transfer N-type FET N3 and the gate electrode of the transfer N-type FET N4 are connected to a word line NWL different from the word line PWL described above. Thus, by setting the word line NWL to the high level at a timing different from the timing of the word line PWL, a logical value different from the logical value of the memory cell 2 can be written to the memory cell 3. In the first embodiment, the memory cell 2 used to store the logical value "+1" in the product operation memory cell 1 is controlled by the word line PWL, and the memory cell 3 used to store the logical value "−1" in the product operation memory cell 1 is controlled by the word line NWL.

The switch 4 described in FIG. 1 is comprised of an N-type FET N5, the switch 5 is comprised of an N-type FET N6, and the switch 6 is comprised of an N-type FET N7. That is, a source-drain path of the N-type FET N5 is connected between the node n1 and the data line PBL, and its gate electrode is connected to the node n2 of the memory cell 2. A source-drain path of the N-type FET N6 is connected between the node n1 and the data line NBL, and its gate electrode is connected to the node n2 of the memory cell 3. Further, a source-drain path of the N-type FET N7 is connected between the node n1 and a voltage line CVSS, and its gate electrode is supplied with the input data INP. Although not particularly limited, a constant current source 7 (not shown) is connected to the voltage line CVSS. It is needless to say that the ground voltage Vs may be supplied to the voltage line CVSS.

In the first embodiment, loads 10 and 11 are connected between the data lines PBL, NBL and the power supply voltage Vd, respectively. A current is supplied to the data lines PBL, NBL via loads 10 and 11.

<Writing a logical value to the product operation memory cell and the product operation> When the logical value "+1" is written to the product operation memory cell 1, the word line PWL is set to a high level in a condition in which a high level is supplied to the complementary data line BT and a low level is supplied to the complementary data line BB. As a result, the memory cell 2 is selected, the transfer N-type FETs N3 and N4 in the memory cell 2 are turned to the on state, and the low level is supplied to the input of the second inverter circuit IV2. As a result, the latch circuits in the memory cell 2 latches a state in which the node n2 is set to a high level. Subsequently, the word line NWL is set to the high level while the high level is supplied to the complementary data line BB and the low level is supplied to the complementary data line BT. As a result, the memory cell 3 is selected, the transfer N-type FETs N3 and N4 in the memory cell 3 are turned to the on state, and the high level is supplied to the input of the second inverter circuit IV2. As a result, the latch circuit in the memory cell 3 latches the state in which the node n2 is set to the low level state.

As a result, the N-type FET N5 is turned to the on state, and the N-type FET N6 is turned to the off state. In this state, if the input data INP is at a high level, for example, the N-type FET N7 is turned to the on state, and the N-type FET N5 and the N7 form a current path for causing a current to flow from the data line PBL to the voltage line CVSS.

Although the case of writing the logical value "+1" to the product operation memory cell 1 has been described, a case of writing the logical value "−1" and a case of writing the logical value "0" are also similar. When the logical value "−1" is written in the product operation memory cell 1, if the input data INP is at the high level, a current path connecting the data line NBL and the voltage line CVSS is formed by the N-type FET N6 and the N7. On the other hand, when the logical value "0" is written in the product operation memory cell 1, no current path connecting data lines PBL, NBL and voltage line CVSS is formed even if the input data INP is at the high level.

<Sum operation> A large number of product operation memory cells 1 shown in FIG. 2 are connected to the data lines PBL, NBL. As a result, a current corresponding to the sum of the numbers of current paths formed in the respective product operation memory cell flows through the data lines PBL, NBL. That is, a current corresponding to the sum of products on the logical value "+1" side flows in the data line PBL, and a current corresponding to the sum of products on the logical value "−1" side flows in the data line NBL. As a result, the result of the product-sum operation on the logical value "+1" side is output to the data line PBL, and the result of the product-sum operation on the logical value "−1" side is output to the data line NBL. Therefore, the expected product-sum operation result can be obtained by an analog/digital conversion (A/D conversion) of the difference between the current in the data line PBL and the current in the data line NBL. Of course, the currents flowing through each of the data lines PBL and the NBL may be A/D-converted to obtain the difference of the obtained digital signals.

In first embodiment, the ternary logical value of "+1", "0", and "−1" used in the product-sum operation is stored in the product operation memory cell 1. Therefore, it is possible to prevent the data used in the learning or inference from being excessively compressed, and it is possible to improve the accuracy of the learning or inference. In addition, a large number of product-sum operation can be performed by changing the input data INP without changing the logical value stored in the product operation memory cell 1. Therefore, it is possible to reduce the number of times of data transfer processing. Further, since the sum operation is realized by drawing a current from each of the data lines PBL, NBL by the product operation memory cell 1, a plurality of sum operations can be executed in one operation. As a result, the number of times of data transfer processing can be further reduced, and a power consumption can be reduced.

Second Embodiment

Figure 3:
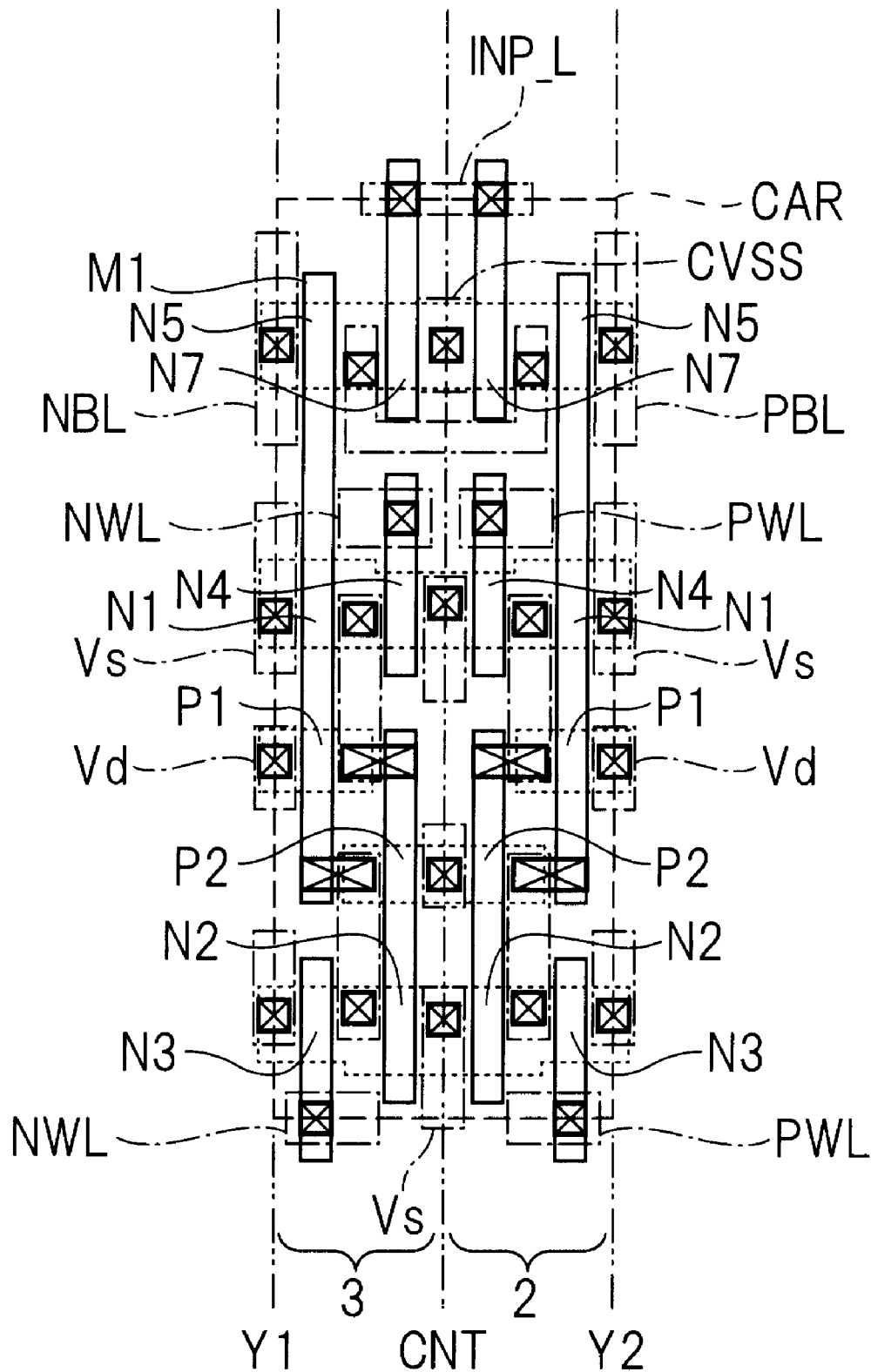
FIG. 3 is a plan view showing a layout of a semiconductor device related to a second embodiment.

FIG. 3 is a plan view showing a layout of a semiconductor device related to a second embodiment. FIG. 3 shows the layout of the product operation memory cell 1 described with reference to FIG. 2. In the second embodiment, the product operation memory cell 1 is formed using so-called planar FETs. In FIG. 3, one product operation memory cell 1 is arranged in a cell area CAR surrounded by a thin broken line. In the second embodiment, the memory cell 2 and the memory cell 3 are symmetrically arranged about an imaginary straight line CNT indicated by a two-dot chain line passing through the center of the cell area CAR.

In FIG. 3, a region surrounded by a solid line indicates a wiring forming a gate electrode of an FET, and a region surrounded by a broken line indicates a semiconductor region forming a source region or a drain region of the FET. The region surrounded by a dashed-dotted line indicates a metal wiring formed by a metal wiring layer (conductive layer) of a first layer M1. Further, a region surrounded by a solid line and marked with a cross indicates a contact region. The contact region electrically connects, for example, two layers overlapping the contact region. In FIG. 3, the sign of the P-type FET and the N-type FET described with reference to FIG. 2 are attached to the gate electrode portion. The gate electrode portion to which the sign is attached constitutes a gate electrode constituting the FET of the sign.

The gate electrodes of the P-type FETs P1, P2, and the N-type FETs N1 to N7 constituting the product operation memory cell are arranged so as to be parallel to the imaginary straight line CNT. A gate electrode constituting the P-type FET P1 and the N-type FET N1 on the complementary data line BB-side are extended to constitute a gate electrode of the N-type FET N5 or N6 constituting the switch. That is, the gate electrode of the P-type FET P1 and the N-type FET N1 constituting the memory cell 2 and 3 and the gate electrode of the N-type FET N5 or N6 constituting the switch are integrally formed. Furthermore, two N-type FETs N7 constituting the switch 6 are arranged in parallel in order to maintain symmetry between the memory cells 2 and 3.

In the layout shown in FIG. 3, contact regions connecting the data lines PBL, NBL to the semiconductor region are arranged at the boundaries of the cell regions CAR. Likewise, the contact regions connecting the complementary data line BB and the semiconducting regions are also arranged at the boundaries of the cell regions CARs. Therefore, although not shown, the product operation memory cell 1 adjacent to the product operation memory cell 1 shown in FIG. 3 is arranged such that the product operation memory cell 1 shown in FIG. 3 is mirror-inverted with reference to the virtual Y-axis straight lines Y1 and Y2 shown by the two-dot chain line. As a result, the data line PBL, NBL and the complementary data line BB can be shared between the neighboring product operation memory cells 1.

In first embodiment, four more metal wiring layers M2 to M5 are stacked on the region shown in FIG. 3. This four metal wiring layers will be described with reference to the drawings.

FIG. 4 is a diagram showing layouts of the semiconductor device related to the second embodiment. FIG. 4A shows wiring by a metal wiring layer of a second layer M2 formed in an upper layer of the metal wiring layer of a first layer M1 shown in FIG. 3, and FIG. 4B shows wirings by a metal wiring layer of a third layer M3 formed in an upper layer of the metal wiring layer of a second layer M2. FIG. 4C shows wirings of a metal wiring layer of a fourth layer M4 formed in an upper layer of the metal wiring layer of the third layer M3, and FIG. 4D shows wirings of a metal wiring layer of a fifth layer M5 formed in an upper layer of the metal wiring layer of a fourth layer M4.

In FIG. 4, a region surrounded by a solid line and marked with a cross indicates a via region. In the via region, an opening is provided in an insulating layer between a metal wiring on the lower layer side and a metal wiring on the upper layer side, and the metal wiring on the lower layer side and the metal wiring on the upper layer side are electrically connected to each other through the opening. That is, in FIG. 4A, the metal wiring of the first layer shown by the thick dashed-dotted line and the metal wiring of the second layer shown by the thin dashed-dotted line are connected by the via region, and in FIG. 4B, the metal wiring of the second layer shown by the thin dashed-dotted line and the metal wiring of the third layer shown by the thick dashed-dotted line are connected by the via region. Further, in FIG. 4C, the metal wiring of the third layer shown by the thick two-dot chain line and the metal wiring of the fourth layer shown by the thin two-dot chain line are connected by the via region, and in FIG. 4D, the metal wiring of the fourth layer shown by the thin two-dot chain line and the metal wiring of the fifth layer shown by the thick two-dot chain line are connected by the via region.

In the second embodiment, the metal wirings formed by the metal wiring layer of the second layer M2 shown in FIG. 4A constitute complementary data lines BB and BT. In addition, the word lines NWL and PWL are formed by the metal wirings formed by the metal wiring layer of a third layer M3 shown in FIG. 4B.

In the second embodiment, the wirings for achieving the function of the product-sum operation, i.e., the data lines PBL, NBL, and voltage line CVSS shown in FIG. 2, are formed by two metal wiring layer that differ from each other. That is, the metal wirings formed by the metal wiring layer of the second layer M2 shown in FIG. 4A and the metal wiring formed by the metal wiring layer of the fourth layer M4 shown in FIG. 4C are used as the data lines PBL, NBL, and voltage line CVSS, and extend in the same directions. As a result, the wirings for achieving the function of the product-sum operation has a configuration in which two metal wirings are connected in parallel, and the wiring resistance can be reduced.

<Sum operation> As described above, the result of product-sum operation is converted into a current. Therefore, if the wiring resistance is large, a current value changes depending on the position of the product operation memory cell forming the current path, so that it is desirable to reduce the wiring resistance as in the second embodiment.

As shown in FIG. 4D, the metal wiring supplying the ground voltage Vs is formed by the metal wiring layer M5 of the fifth layer. As shown in FIG. 4D, the metal wirings supplying the ground voltage Vs are disposed so as to partially cover the data line PBL, NBL, and the voltage line CVSS. As a result, the metal wirings supplying the ground voltage Vs function as noise shields for the data line PBL, NBL, and the voltage line CVSS.

According to the second embodiment, the product operation memory cell 1 can be formed in a small area. In addition, a resistance of the product-sum operation function can be improved against a variation in a wire resistance and the like.

Third Embodiment

In a third embodiment, the product operation memory cell 1 is comprised of a three-dimensional FET called a FinFET. FIG. 5 are a plan views showing the layouts of semiconductor device related to the third embodiment. FIG. 5 shows a layout in which the product operation memory cell 1 shown in FIG. 2 is comprised of fin-type FETs. Here, in FIG. 5A, a region surrounded by a solid line indicates a gate electrode, a region surrounded by a broken line indicates a fin, and a region surrounded by a thin two-dot chain line indicates a metal wiring formed by the metal wiring layer of the first layer M1.

In FIG. 5A, a region surrounded by a thin dashed-dotted line indicates a gate local interconnect (LIC) region for connecting the gate electrode and another region, and a region surrounded by a thick dashed-dotted line indicates a fin (Fin) LIC region for connecting the fin and another region. Further, a region surrounded by a solid line and marked with a cross indicates a contact region. In a process of fabricating a FinFET, connections between fins and metal lines are connected by an LIC region rather than by a contact region.

In the third embodiment, similarly to the second embodiment, the memory cells 2 and 3 are symmetrically arranged about the virtual straight line CNT, and the adjacent product operation memory cell is mirror-inverted with reference to the virtual Y-axis straight lines Y1 and Y2. In the third embodiment, the N-type FETs N5, N6 constituting the switch are separated from the N-type FET N7 constituting the switch. That is, in the drawing, the N-type FET N7 is disposed above the N-type FETs N5, N6, and a common source region of the N-type FETs N5, N6 and a drain region of the N-type FET N7 are connected by an LIC region.

In the product operation memory cell of the second embodiment, wirings are performed using the metal wiring layer of the first layer M1 to the metal wiring layer of the fifth layer M5, but in the third embodiment, connections are performed by the metal wirings formed by the metal wiring layers of the first layer and the second layer. FIG. 5B shows a metal wiring formed by the metal wiring layer of the second layer. In FIG. 5B, the region surrounded by the thick two-dot chain line indicates the metal wiring formed by the second-layer metal wiring layer M2. In the third embodiment, the word lines PWL, NWL, the input wiring INP_L for supplying the input data INP, and a wiring supplying the ground voltage Vs are formed by the metal wiring layer of the second layer. Of course, similarly to the second embodiment, the data lines NBL, PBL, and the voltage line CVSS may be connected to the metal wiring formed by the metal wiring layer of the upper layer to reduce the wiring resistances.

According to the third embodiment, a semiconductor device with a product operation memory cell can be realized by FinFETs.

Fourth Embodiment

In a fourth embodiment, a set of data lines PBL, NBL are shared by a plurality of product operation memory cells 1 connected to the same input wiring INP_L. That is, a plurality of product operation memory cells 1 are connected to a set of data lines PBL, NBL and one input wiring INP_L, a product operation memory cell is selected from a plurality of product operation memory cells 1 by a selection signal, and the data lines PBL, NBL, and the input wiring INP_L are used by the selected product operation memory cell.

Figure 6:
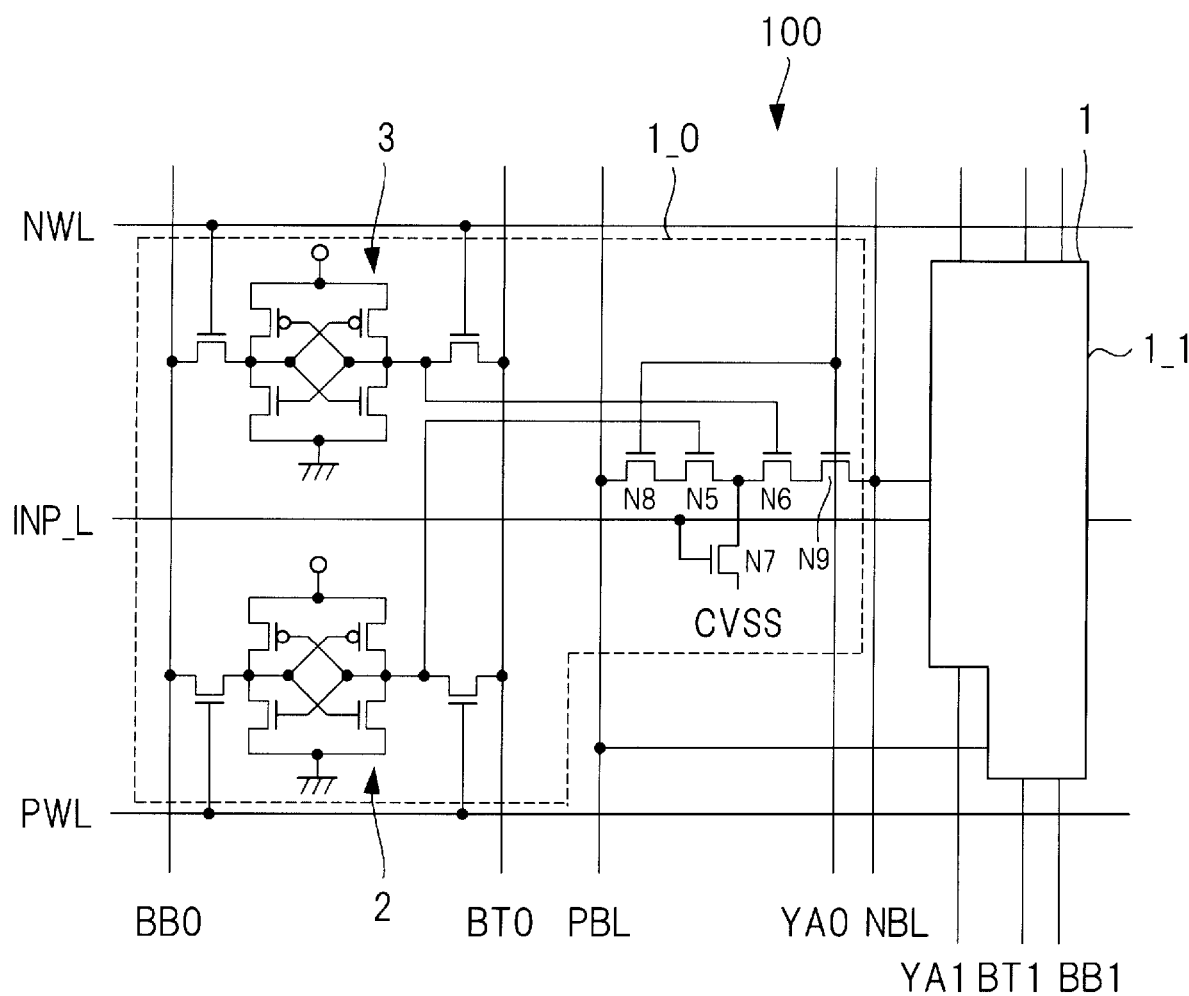
FIG. 6 is a schematic diagram showing a configuration of a semiconductor device related to a fourth embodiment.

FIG. 6 is a schematic diagram showing a configuration of the semiconductor device related to a fourth embodiment. The semiconductor device 100 includes a plurality of product operation memory cells connected to data lines PBL, NBL. In FIG. 6, two product operation memory cells 1_0 and 1_1 connected to data lines PBL, NBLs are illustrated. Since the configurations of product operation memory cells 1_0 and 1_1 are the same, FIG. 6 shows a detailed configuration only for the product operation memory cell 1_0.

The product operation memory cell 1_0 is similar to the product operation memory cell 1 shown in FIG. 2. The difference is that N-type FETs N8 and N9 are added for a selection, and a column address YA0 is supplied as a selection signal to the N-type FETs N8 and N9. A source-drain path of the N-type FET N8 is connected between the N-type FET N5 and the data line PBL, and a source-drain path of the N-type FET N9 is connected between the N-type FET N6 and the data line NBL. The column address YA0 is commonly supplied to the gate electrode of the selection N-type FET N8 and the gate electrode of the selection N-type transistor N9. Thus, when the product operation memory cell 1_0 is selected by setting the column address YA0 to the high level, the N-type FETs N5, N6 are connected to the data line PBL, NBL, and the product operation is executed. The product operation is performed between the logical value stored in the product operation memory cell 1_0 and the logical value of the input data INP, and the sum operation is performed between the result of the product operation and the logical value in the data lines PBL, NBL. At this time, the column address YA1 is set to the low level so that the column address product operation memory cell 1_1 is not selected.

When the column address product operation memory cell 1_1 is selected by the column address YA1, the product operation is executed between the logical value stored in the product operation memory cell 1_1 and the logical value of the input data INP, and the sum operation is executed between the result of the product operation and the logical value in the data lines PBL, NBL.

In the fourth embodiment, the product operation memory cell 1_0 and 1_1 are connected to different complementary data lines BB0, BT0, BB1, and BT1. Therefore, even if the word lines NWL and PWL are shared by the product operation memory cells 1_0 and 1_1, the product operation memory cells 1_0 and 1_1 can be written with different ternary logical value. Of course, complementary data lines may be shared between product operation memory cells 1_0 and 1_1, and the word lines may differ. In the fourth embodiment, the input wiring INP_L for supplying the input data INP to the product operation memory cells 1_0 and 1_1 is shared, but different input wirings may be used as a matter of course.

In FIG. 6, by supplying the column address YA0, YA1 to the product operation memory cells 1_0, 1_1, an address space formed by the product operation memory cell 1 can be expanded. Thus, for example, a plurality of pieces of data for executing the product-sum operation are stored in advance in the product operation memory cells 1_0 and 1_1, and data for executing the product-sum operation can be selected by the column addresses.

Modified Example

In a Modified example, column address YA0 and YA1 are simultaneously set to the high level. This enables a sum operation to be performed among a result of the product operation in the product operation memory cell 1_0, a result the product operation in the product operation memory cell 1_1, and the data in the data line PBL, NBL. Assuming that one combination product operation memory cell is configured by combining product operation memory cells 1_0 and 1_1, one combination product operation memory cell can store five values exceeding ternary values such as "+2", "+1", "−1", "−1", and "+2", instead of ternary value of "+1", and "−1", and product operation can be performed between the logical value of five values and the input data INP. Although a combination of two product operation memory cells has been shown, more product operation memory cell combinations can be used to store more multi-valued data in the product operation memory cell.

Figure 7A:
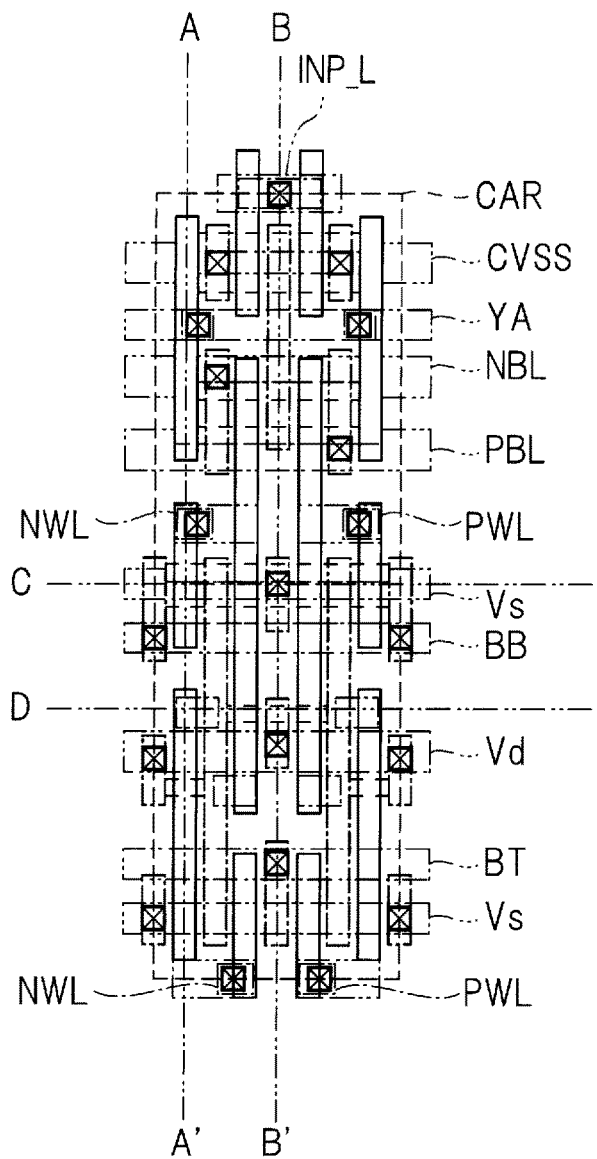
FIGS. 7A and 7B are plan views showing layouts of the semiconductor device related to the fourth embodiment.
Figure 7B:
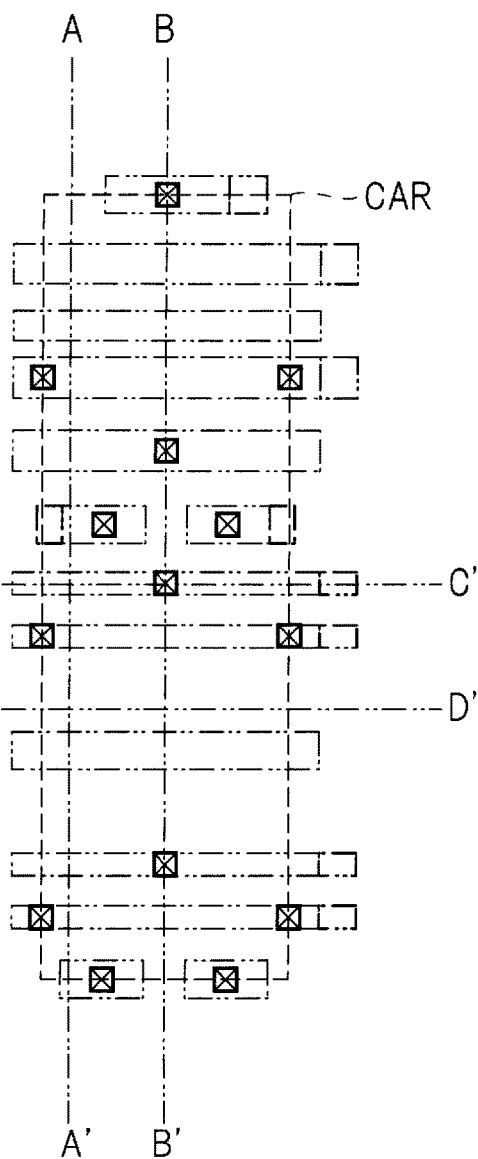
Figure 8C:
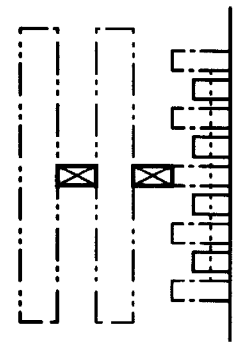
FIG. 8A-8D are cross-sectional views showing cross-sections of the semiconductor device related to the fourth embodiment.
Figure 8D:
Figure 8A:
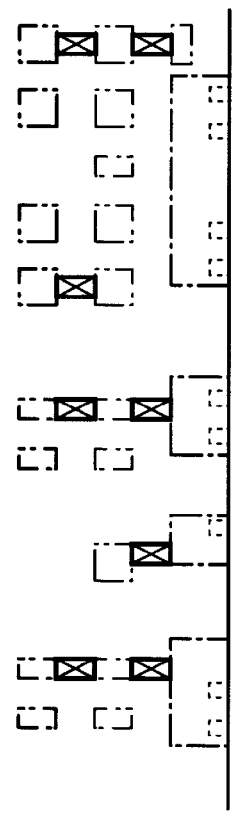
Figure 8B:
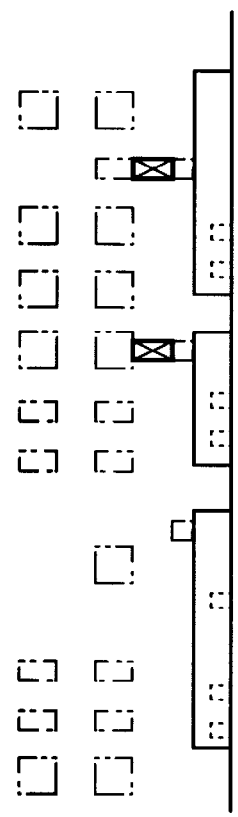

FIG. 7 are a plan views showing layouts of semiconductor device related to the fourth embodiment. FIG. 7 shows layouts when product operation memory cell 1_0 shown in FIG. 6 is formed by FinFET in the same manner as in FIG. 5. Here, FIG. 7A is similar to FIG. 5A, and the difference is that a wiring for supplying the column address YA and N-type FETs N8 and N9 for selection are added. In FIG. 7B, similarly to FIG. 5B, the metal wiring formed by the metal wiring layer of the second layer M2 is shown as an area surrounded by a thick two-dot chain line.

FIG. 8 is a cross-sectional view showing a cross-section of a semiconductor device relating to the fourth embodiment. That is, FIG. 8A shows an A-A' cross-section in FIGS. 7A and 7B, FIG. 8B shows a B-B' cross-section in FIGS. 7A and 7B, FIG. 8C shows a C-C' cross-section in FIGS. 7A and 7B, and FIG. 8D shows a D-D' cross-section in FIGS. 7A and 7B. As shown in FIG. 8A to 8C, the metal wiring formed by the metal wiring layer of the second layer M2 is arranged so as to overlap with the metal wiring formed by the metal wiring layer of the first layer M1, and are electrically connected. As a result, the resistance of the metal wiring is reduced.

The metal wiring layer of the second and higher layers can suppress an increase in a resistivity of the metal wirings due to a miniaturization in the same manner as shown in FIG. 4B to 4D. Also in this case, the data lines NBL, PBL, and voltage line CVSS are formed of the third or higher layers of metal wiring layer, for example, as shown in FIG. 4C. In FIG. 8, an insulating film between the interlayers, for example, between the metal wiring layers M1 and M2 is omitted.

According to the fourth embodiment, it is possible to increase a memory capacity by expanding an address space of the memory constituted by the product operation memory cell. The data stored in the product operation memory cell can be further multi-valued, and the accuracy of learning and inference can be improved. Further, the user can select a large memory capacity or an improvement in accuracy by operating the column address, and can increase the degree of freedom.

Fifth Embodiment

The product operation memory cell stores data to multiply by the input data INP. In a fifth embodiment, a product operation memory cell capable of efficiently multi-value the data to multiply is provided.

The product operation memory cell described in the fourth embodiment allows increasing memory capacity and multi-valuing the data to be changed flexibly. However, when only multi-leveling is performed, the number of FETs constituting the product operation memory cell increases. For example, when 15-value data of "+7" to "−7" is stored in one combinational product operation memory cell in the fourth embodiment, six FETs are required to configure each of memory cells 2 and 3 as shown in FIG. 6. In order to realize the selection and sum-of-products function, the FET constituting the switch and the FET for selection are also required. Therefore, 12 FETs for memory cell and FETs for the selection and the sum-of-products function are required to constitute one product operation memory cell. In order to store data of 15 values, seven pieces of product operation memory cell constitute one combinational product operation memory cell. Therefore, one combinational product operation memory cell requires FETs of number of (2 memory cells (12 FETs)+FETs for the selection and sum-of-products function)×7.

Figure 9:
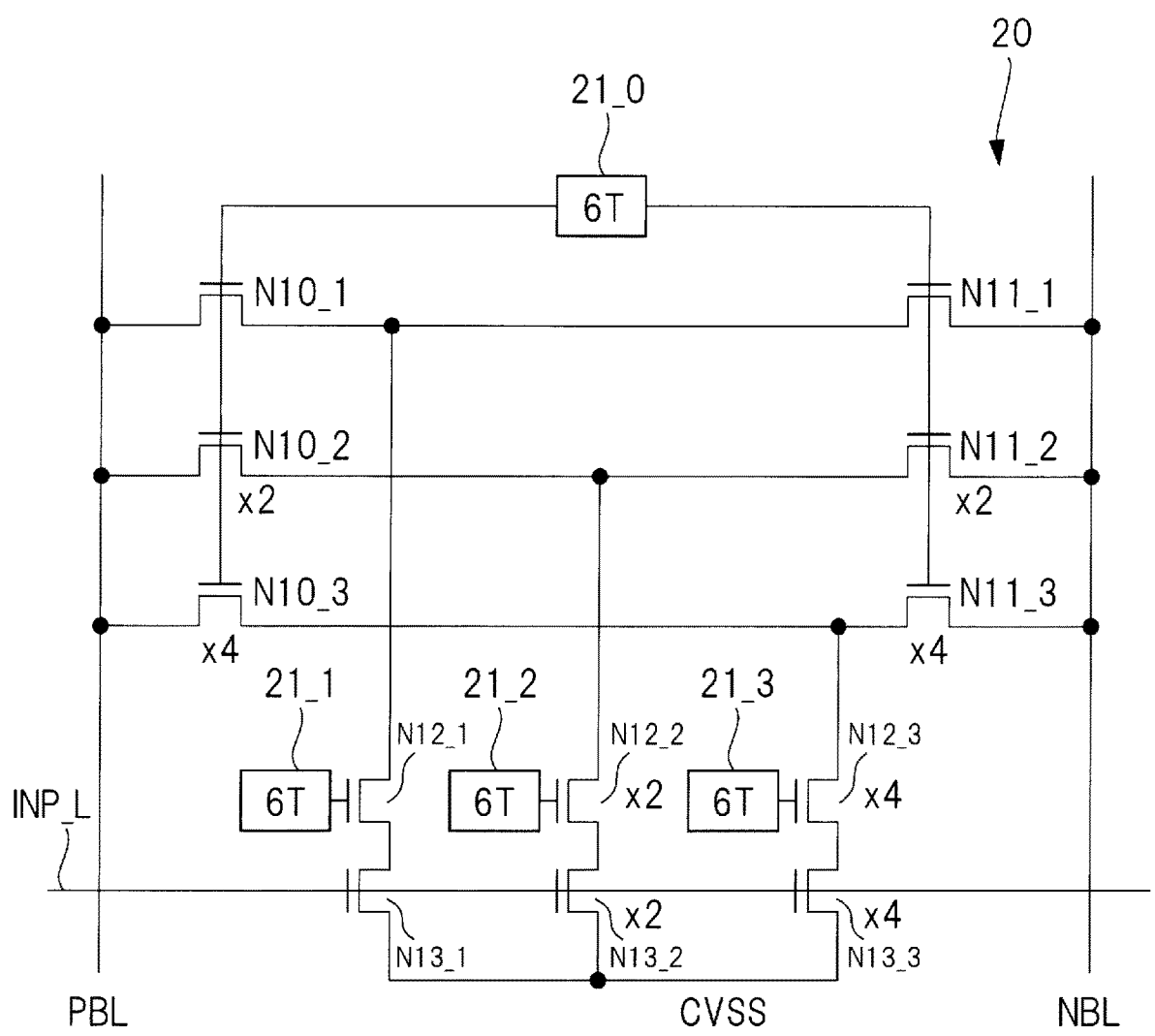
FIG. 9 is a schematic diagram showing a configuration of a product operation memory cell related to a fifth embodiment.

FIG. 9 is a circuit diagram showing the configuration of a product operation memory cell related to the fifth embodiment. The product operation memory cell 20 includes four memory cells 21_0 to 21_3, and twelve N-type FETs N10_1 to N10_3, N11_1 to N11_3, N12_1 to N12_3, and N13_1 to N13_3. The memory cells 21_0 to 21_3 have, for example, the same configuration as the memory cell 2 shown in FIG. 2. Therefore, each of the memory cell 21_0 to 21_3 is comprised of six FETs.

The gate electrodes of the N-type FETs (second switch) N10_1 to N10_3 are connected to one output of the memory cell 21_0, and the gate electrodes of the N-type FETs (second switch) N11_1 to N11_3 are connected to the other output of the memory cell 21_0. One output of the memory cell 21_1 corresponds to a node connecting between the N-type FET N1 and the P-type FET P1 shown in FIG. 2, and the other output corresponds to the node n2 shown in FIG. 2.

The source-drain path of the N-type FET N10_1 and the source-drain path of the N-type FET N11_1 are connected in series between the data lines PBL and NBL. A source-drain path of the N-type FET (first switch) N12_1 and a source-drain path of the N-type FET N13_1 are connected in series between the voltage line CVSS and a node connecting the N-type FETs N10_1 and N11_1. Input data INP is supplied to the gate electrode of the N-type FET (third switch) N13_1, and the gate electrode of the N-type FET N12_1 is connected to a node n2 (see FIG. 2) of the memory cell 21_1. N-type FETs N10-2, N11-2, N12-2, N13-2, and memory cell 21-2 are also connected in the same way as the N-type FETs N10-1, N11-1, N12-1, N13-1, and the memory cell 21-1 mentioned above. The N-type FETs N10_3, N11_3, N12_3, N13_3, and memory cell 21_3 are also connected in the same way as the N-type FETs N10_1, N11_1, N12_1, N13_1, and memory cell 21_1 mentioned above.

The memory cell (second memory cell) 21_0 stores a sign bit indicating positive and negative signs of the multi-valued data stored in the product operation memory cell 20. The memory cells (first memory cells) 21_1 to 21_3 store bits indicating absolute values of the multi-valued data to be stored. In the fifth embodiment, multi-valued data is represented by bits weighted to "1", "2", and "4", and a bit representing the weight "1" is stored in the memory cell 21_1, a bit representing the weight "2" is stored in the memory cell 21_2, and a bit representing the weight "4" is stored in the memory cell 21_3.

The N-type FETs N10_1 to N10_3, N11_1 to N11_3, N12_1 to N12_3, and N13_1 to N13_3 are set so as to be able to flow a current corresponding to the weight stored in the corresponding memory cell. For example, when the size of the N-type FETs N10_1, N11_1, N12_1, and N13_1 corresponding to the memory cell 21_1 are set to a reference size, the size of the N-type FETs N10_2, N11_2, N12_2, and N13_2 corresponding to the memory cell 21_2 is set to twice the reference size. The size of the N-type FETs N10_3, N11_3, N12_3, and N13_3 corresponding to the memory cell 21_3 is set to four times the reference size.

For example, when the input data INP is a high-level logical value "1", the low level logical value "0" is output from the memory cell 21_2 and 21_3, and the high level logical value "1" is output from the memory cell 21_1, the N-type FETs N12_1 and N13_1 are turned to the on state, and a reference current representing "1" flows through these N-type FETs. At this time, the N-type FETs N10_1 to N10_3 or N11_1 to N11_3 are turned to the on state by the sign bit stored in the memory cell 21_0. As a result, a reference current flows from the data line PBL or NBL to the voltage line CVSS.

Similarly, for example, when the input data INP is a high level logical value "1", the high level logical value "1" is output from the memory cell 21_2 and 21_3, and the low level logical value "0" is output from the memory cell 21_1, the N-type FETs N12_2, 13_2, N12_3, and N13_3 are turned to the on state. By the sign bit at this time, the N-type FETs N10_1 to N10_3 or N11_1 to N11_3 are turned to the on state. As a result, a current of six times the reference current flows from the data line PBL or NBL to the voltage line CVSSs.

In this manner, the product operation between the input data INP and the data stored in the product operation memory cell 20 is executed, and a current corresponding to the execution result of the product operation flows from the data line PBL or NBL toward the voltage line CVSS, and the sum calculation can be performed.

The product operation memory cell 20 shown in FIG. 9 can be comprised of 4 memory cells and 12 N-type FETs. Since each memory cell is comprised of six FETs, the number of FETs necessary by the product operation memory cell 20 is 4×6+12=36. The number of FETs required in the fourth embodiment is 2×7×6=84, even if only the number of FETs constituting memory cell is calculated. Even if only the number of FETs constituting the memory cell is considered, 14 memory cells can be reduced to 4.

Though omitted in FIG. 9, the memory cells 21_0 to 21_3 are connected to the word line and the complementary data lines as described with reference to FIG. 2. A memory cell is selected from memory cells 21_0 to 21_3 by the word line and complementary data lines, and the sign bit or absolute value bit is written to the selected memory cell. In the example of FIG. 9, the number of absolute value bits is 3 bits, and the number of sign bit is 1 bit. Therefore, 3 bits are decoded to represent "0" to "7", and 15 values of "+7" to "0" to "−7" can be represented by assigning positive and negative sign by the sign bit.

According to the fifth embodiment, since data of more values can be stored in a product operation memory cell comprised of a small number of FETs, the product operation memory cell can be reduced in area.

Sixth Embodiment

Figure 10:
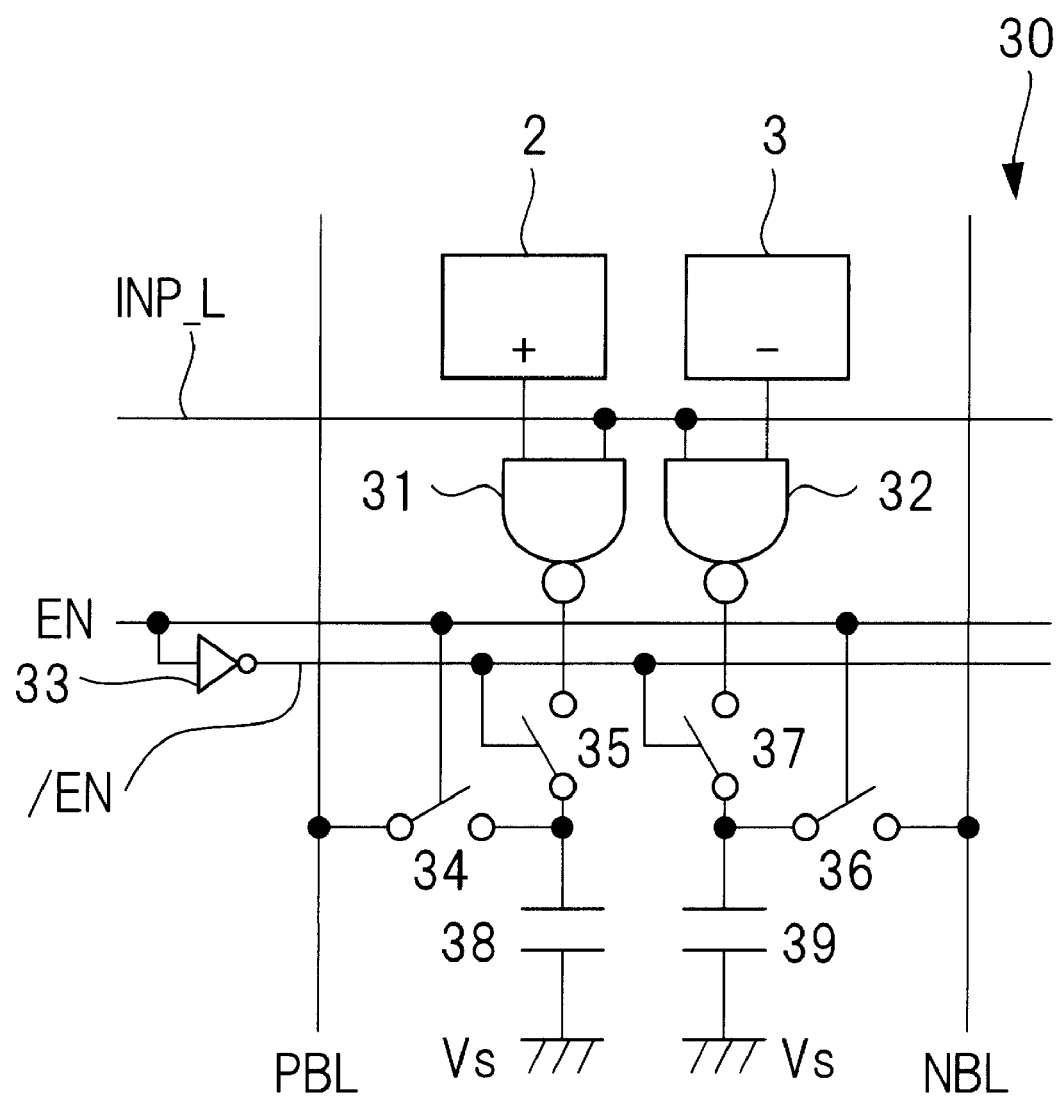
FIG. 10 is a schematic diagram showing a configuration of a product operation memory cell according to a sixth embodiment.

FIG. 10 is a circuit diagram showing a configuration of a product operation memory cell according to a sixth embodiment. In the sixth embodiment, a product operation memory cell for realizing a sum operation by a voltage is provided. In FIG. 10, a reference numeral 30 denotes a product operation memory cell. The product operation memory cell 30 includes two memory cells 2 and 3, NAND circuits 31 and 32 corresponding to the memory cells 2 and 3, switches 34 to 37 controlled based on the an enable signal EN, and capacitive elements 38 and 39 corresponding to the memory cells 2 and 3.

As described in FIG. 1, the memory cell 2 is used to store the logical value "+1" in the product operation memory cell 30, and the memory cell 3 is used to store the logical value "−1" in the product operation memory cell 30. An output of the memory cell 2 and the input data INP are supplied to the NAND circuit 31, and the NAND circuit 31 performs a NAND operation and outputs its result. Similarly, an output of the memory cell 3 and the input data INP are supplied to the NAND circuit 32, and the NAND circuit 32 performs a NAND operation and outputs its result.

An output of the NAND circuit 31 is supplied to one electrode of the capacitive element 38 via the switch 35, and an output of the NAND circuit 32 is supplied to one electrode of the capacitive element 39 via the switch 37. The other electrodes of the capacitive elements 38 and 39 are supplied with the ground voltage Vs. One electrode of the capacitive element 38 is connected to the data line PBL via the switch 34, and one electrode of the capacitive element 39 is connected to the data line NBL via the switch 36.

The switches 35 and 37 are controlled to be the on state or the off state by the enable signal EN. A logically inverted enable signal/EN is supplied to the switches 34 and 36. In FIG. 10, the inverter circuit 33 logically inverts the enable signal EN and outputs the inverted enable signal/EN. The inverter circuit 33 may be provided in the product operation memory cell 30, or the inverter circuit 33 may be commonly provided in a plurality of product operation memory cell circuits 30.

In the product operation memory cell 30 shown in FIG. 10, when the enable signal EN is a logical value "0" at the low level, the result of the NAND performed in the NAND circuits 31 and 32 is stored in the corresponding capacitive elements 38 and 39. A sum operation of the stored result and the data in the data line PBL, NBL is executed when the enable signal EN is a logical value "1" at the high level. Hereafter, a concrete description will be given.

When the enable signal EN is at a low level, the switches 35 and 37 are supplied with the enable signal/EN at a high level, so that the switches 35 and 37 are turned to the on state. As a result, the outputs of the NAND circuits 31 and 32 are electrically connected to one of the electrodes of the capacitive elements 38 and 39. At this time, the switches 34 and 36 are in the off state by the enable signal EN at the low level, and one of the electrodes of the capacitive elements 38 and 39 is electrically isolated from the data line PBL, NBL. As a result, the capacitive element 38 is charged in accordance with the result of the NAND between the logical value stored in the corresponding memory cell 2 and the logical value of the input data INP. Similarly, the capacitive element 39 is charged in accordance with the result of the NAND between the logical value stored in the corresponding memory cell 3 and the logical value of the input-data INP.

Next, when the enable signal EN becomes a high level, the switches 35 and 37 are turned to the off state, and the switches 34 and 36 are turned to the on state so as to electrically connect the data line PBL, NBL to one of the electrodes of the capacitive elements 38 and 39. When the capacitive element 38 is connected to the data line PBL, charges are dispersed between the parasitic capacitance of the data line PBL and the capacitive element 38, and the voltage of the data line PBL is determined. Similarly, the voltage of the data line NBL is determined by the charge-dispersion performed between the capacitive element 39 and the parasitic capacitance of the data line NBL.

Next, cases where the result of product operation in the product operation memory cell 30 is "0", "+1" and "−1" will be described.

The result of product operation becomes "0" when the input data INP is "0" or data stored in both of the memory cells 2 and 3 are "0". At this time, since the outputs of the NAND circuits 31 and 32 are at a high level such as the power supply voltage Vd, the power supply voltage Vd is charged to the capacitive elements 38 and 39 via the switches 35 and 37. The enable signal EN changes from a low level to a high level, for example, by issuing a product-sum instruction in the semiconductor device. As a result, the capacitive elements 38 and 39 are connected to the data lines PBL, NBL.

On the other hand, when the result of product operation is "+1", the capacitive element 38 corresponding to memory cell 2 is discharged to the low level such as the ground voltage Vs. When the result of the product operation is "−1", the capacitive element 39 corresponding to the memory cell 3 is discharged to the low level. The capacitive elements 38 and 39 are connected to the data lines PBL and NB, respectively, in response to the change of the enable signal EN to the high level.

A plurality of product operation memory cells are connected to the data lines PBL, NBL. Therefore, a difference between the number of the capacitive elements charged to the power supply voltage Vd connected to the data lines PBL, NBL and the number of the capacitive elements discharged to the ground voltage Vs becomes a product sum result. Specifically, the difference between the voltages of the data lines PBL and NBL is a product sum result.

In the sixth embodiment, since the sum operation is performed using the capacitive element, it is possible to reduce the effect of variations in the current of the FET or the like.

Seventh Embodiment

Figure 11:
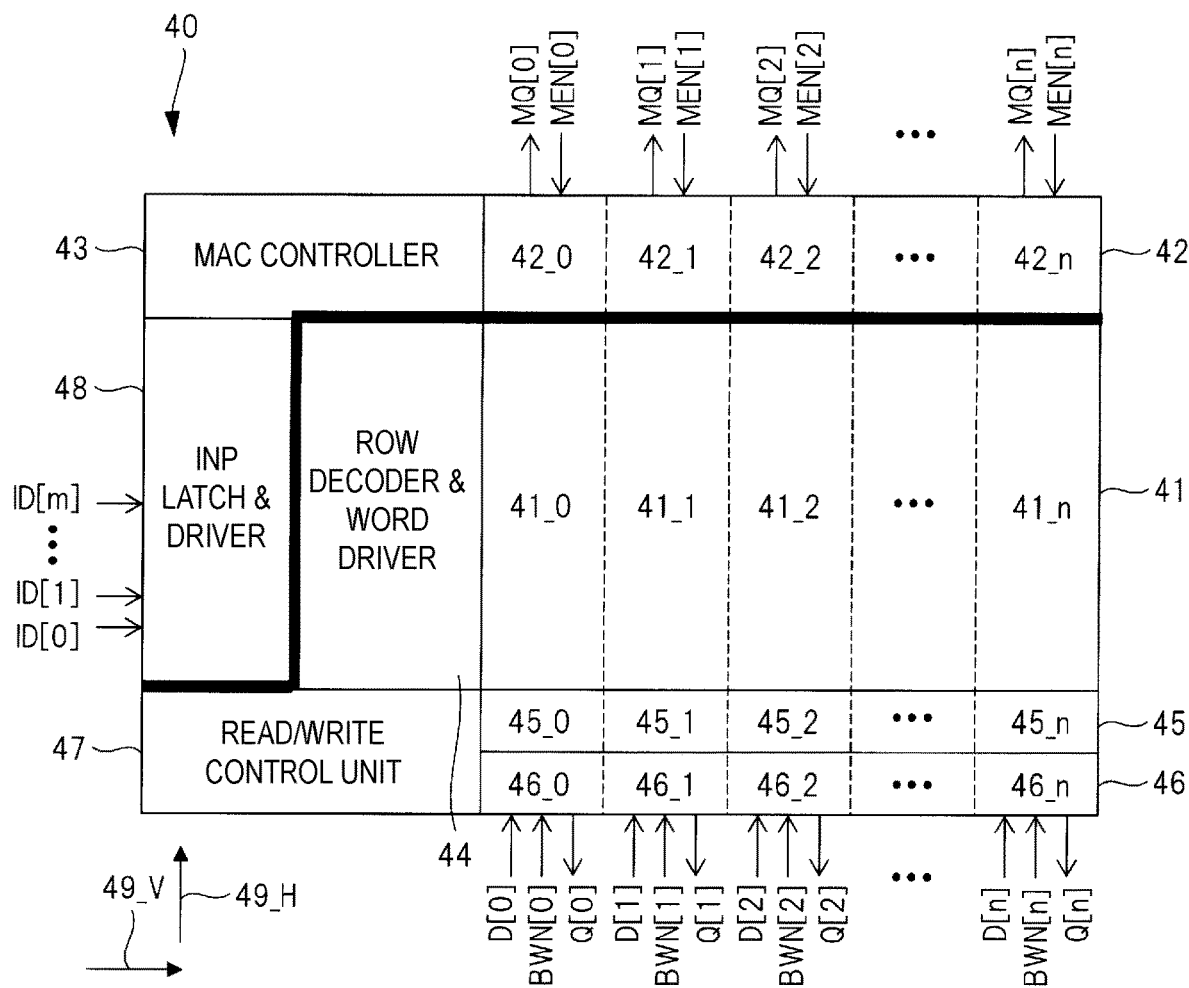
FIG. 11 is a diagram showing a configuration of a semiconductor device according to a seventh embodiment.

FIG. 11 is a diagram showing a configuration of a semiconductor device according to a seventh embodiment. Examples of the semiconductor device include microprocessors that run large amounts of product-sum operation. Although the microcomputer includes a plurality of circuit blocks, FIG. 11 shows only circuit blocks necessary for an explanation. In FIG. 11, reference numeral 40 denotes a memory macro with a product-sum operation function (hereinafter referred to as a memory macro) formed in the semiconductor device.

The memory macro 40 includes a memory array 41 in which product operation memory cells described in the first embodiment to 6 are arranged in a matrix, an A/D converter 42, an INP latch (input data holding circuit) & driver 48 for latching and driving input data, and a MAC controller 43 for controlling the A/D converter 42 and the INP latch & driver 48. The memory macro 40 includes a row decoder & word driver 44, a data write/sense unit 45, an input/output latch unit 46, and a read/write control unit 47. The read/write control unit 47 mainly controls the row decoder & word driver 44, the data write/sense unit 45, and the input/output latch-circuit unit 46, and also performs an entire control of the memory macro 40.

The memory array 41 includes a plurality of memory cell arrays 41_0 to 41_n. The A/D converter 42 includes a plurality of A/D conversion circuit 42_0 to 42_n. Similarly, the data write/sense unit 45 is also configured by a plurality of data write/sense unit circuits 45_0 to 45_n, and the input/output latch circuit section 46 is also configured by a plurality of input/output latch unit circuits 46_0 to 46_n.

The memory cell columns 41_0 to 41_n, the A/D conversion circuit 42_0 to 42_n, the data write/sense unit circuits 45_0 to 45_n, and the input/output latch unit circuits 46_0 to 46_n correspond one-to-one. For example, the memory cell column 41_0, the A/D conversion circuit 42_0, the data write/sense unit circuit 45_0, and the input/output latch unit circuit 46_0 correspond one-to-one.

The memory cell column 41_0 includes, for example, complementary data lines (second data lines) BB, BT, data lines (first data lines) PBL, NBL, and a plurality of product operation memory cell 1 connected to the complementary data lines BB, BT, and data lines PBL, NBL. The complementary data lines BB, BT and the data lines PBL, NBL extend in directions indicated by a sign 49_H in FIG. 11. The A/D conversion circuit 42_0 corresponding to the memory cell column 41_0 converts differences in current amounts between the data lines PBL, NBL provided in the corresponding memory cell column 41_0 into a digital signal, and outputs the result of product-sum operation as a MQ output data MQ[0].

The input data to be stored in the product operation memory cell 1 arranged in the corresponding memory cell column 41_0 is supplied as an input data D[0] to the input/output latch unit circuit 46_0. The input/output latch unit circuit 46_0 latches the supplied input data D[0], supplies the latched input data D[0] to the complementary data lines BB, BT provided in the corresponding memory cell column 41_0 via the corresponding data write/sense unit circuit 45_0, and writes the input data D[0] to the product operation memory cell 1. Although not particularly limited, the input/output latch circuit 46_0 latches the data written in the product operation memory cell 1 via the data write/sense unit circuit 45_0 using the complementary data lines BB, BT provided in the memory cell column 41_0, and outputs the latched data as the output data Q[0].

Although the memory cell column 41_0, the A/D conversion circuit 42_0, the data write/sense unit circuit 45_0, and the input/output latch unit circuit 46_0 corresponding thereto have been described as examples, the remaining memory cell columns 41_1 to 41_n, the A/D conversion circuit 42_1 to 42_n, the data write/sense unit circuits 45_1 to 45_n, and the input/output latch unit circuits 46_1 to 46_n corresponding thereto are also similar.

In FIG. 11, BWM[0] to BWM[n] are bit write enable signals for masking writing of input data in units of input/output latch unit circuits. For example, the bit write enable signal BWM[0] is disabled when the input data D[0] to D[n] are supplied to the input/output latch circuit unit 46 in parallel in time. As a result, the input/output latch unit circuit 46_0 operates so as not to write the input data D[0] being supplied.

In FIG. 11, MEM[0] to MEM[n] are product-sum operation mask signals for masking product-sum operations in units of A/D conversion circuit. For example, by disabling the product-sum operation mask signal MEM[0], the product-sum operation is set not to be performed in the memory cell column 41_0.

In the memory array 41, a plurality of word lines NWL and PWL as shown in FIG. 2 are arranged. For example, the plurality of word lines extend in the direction of the sign 49_V in FIG. 11, and are arranged in the direction indicated by the direction 49_H. The row decoder & word driver 44 is connected to the plurality of word lines, and selects a word line from the plurality of word lines when writing input data D[0] to D[n] to the plurality of product operation memory cells and when reading the input data, and supplies a high level to the selected word line. The row decoder & word driver 44 selects the two word lines NWL and PWL (FIG. 2) connected to the product operation memory as one set. The product operation memory connected to the selected word line is written to and read from the input data.

The memory cell array 41 is provided with a plurality of input wirings for supplying the input data INP (FIG. 2). The input wiring extends in the direction 49_V and is arranged in the direction 49_H in FIG. 11. The INP latch & driver 48 is connected to a plurality of input wirings. The input data ID[0] to ID[m] to be multiplied are supplied to the INP latch & driver 48. The INP latch & driver 48 latches the input data ID[0] to ID[m] supplied thereto, and supplies the latched input data ID[0] to ID[m] to the input wiring as the input data INP. As a result, the input data INP corresponding to the input data ID[0] to ID[m] is supplied to the plurality of product operation memory cell arranged in each of the memory cell columns 41_0 to 41_n. In each operation memory cell, the product operation between the stored data and the input data INP is performed, the sum operation of the product operation results is performed for each memory cell column, and the result is output as MQ output data MQ[0] to MQ[n].

According to the seventh embodiment, since the A/D conversion circuit is provided for each memory cell row, a plurality of product-sum operation can be executed at the same time, and the speed of the product-sum operation can be increased.

Eighth Embodiment

In the eighth embodiment, semiconductor device in which the input data INP is multi-valued is provided. For example, in the fifth embodiment, a configuration in which the number (data) stored in the product operation memory cell is multi-valued has been described. In contrast, in the eighth embodiment, a configuration will be described in which a multiplicand to a number stored in the product operation memory cell is multi-valued.

Figure 12A:
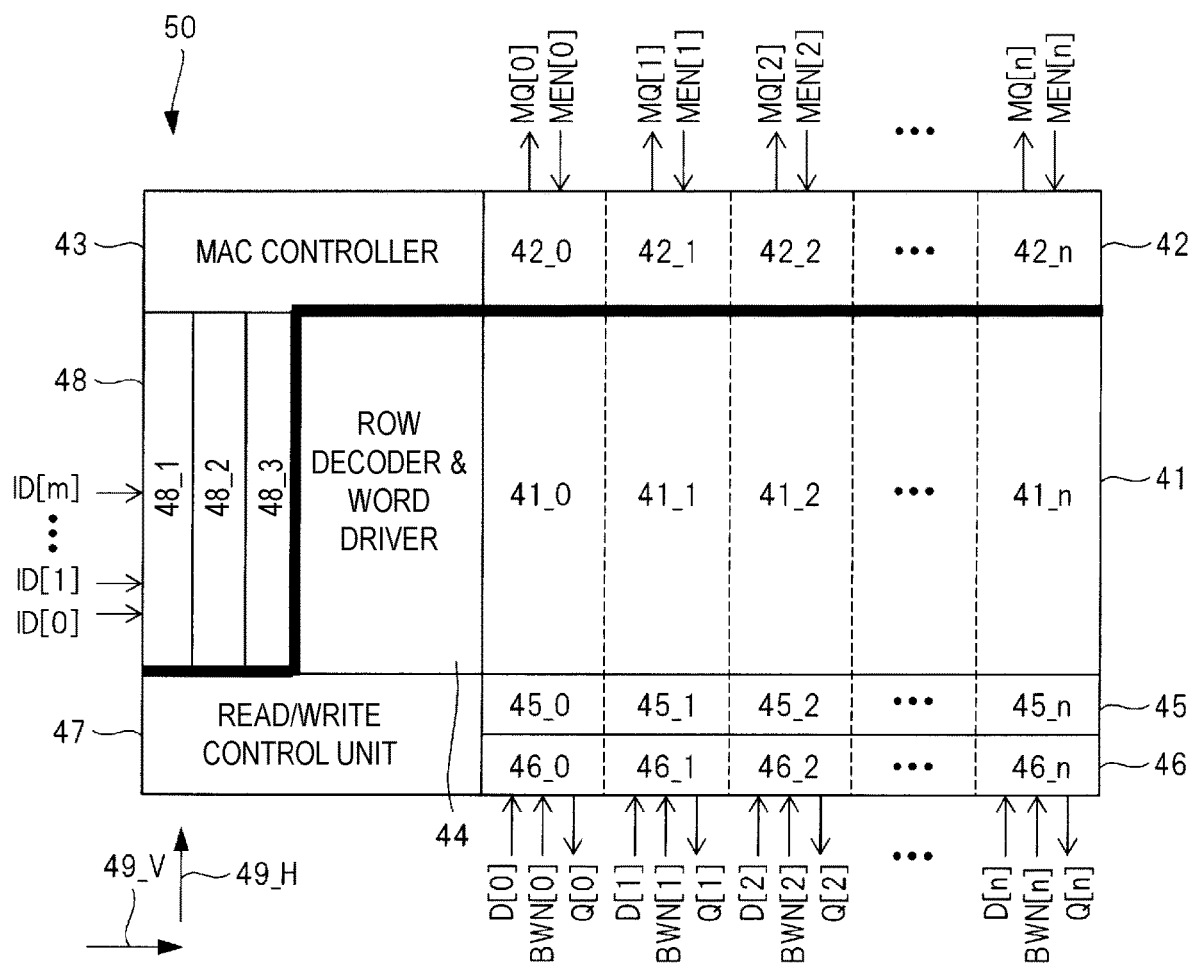
FIGS. 12A and 12B are diagrams for explaining a semiconductor device according to an eighth embodiment.
Figure 12B:
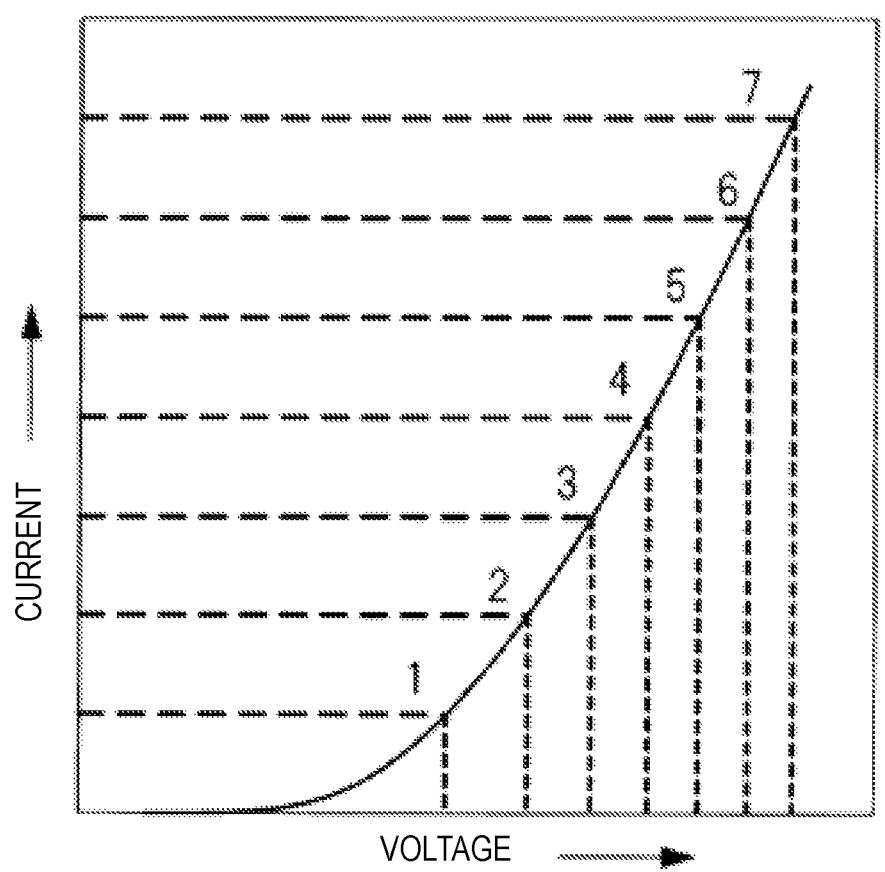

FIG. 12 is a diagram for explaining the semiconductor device according to the eighth embodiment. Here, FIG. 12A is a block diagram showing the configuration of the semiconductor device 50 according to the seventh embodiment, and FIG. 12B is a characteristic diagram for explaining the operation of the semiconductor device 50 shown in FIG. 12A.

Since FIG. 12A is similar to FIG. 11, differences will be mainly explained. In contrast to FIG. 11, the INP latch & driver 48 has been changed in FIG. 12. That is, the INP latch & driver 48 shown in FIG. 11 is changed to an INP latch circuit 48_1, a D/A conversion circuit 48_2, and an INP driver circuit 48_3.

The input data ID[0] to ID[m] supplied to the semiconductor device 50 are multi-valued digital signals. The INP latch circuit 48_1 latches the input data ID[0] to ID[m] and supplies the latched input data to the D/A conversion circuit 48_2. The D/A conversion circuit 48_2 converts each of the supplied input data ID[0] to ID[m] into corresponding analog value, and outputs the analog value to the INP driver circuit 48_3. The INP driver circuit 48_3 supplies an analog value corresponding to the supplied input data ID[0] to ID[m] to the input wiring arranged in the memory cell array 41 as an input data INP (FIG. 2).

The product operation memory cell supplied with the input data INP of the analog value via the input wiring performs a product operation between the input data INP of the stored data and the supplied analog value. Referring to product operation memory cell 1 shown in FIG. 2, when the stored data is a logical value "+1" or "−1", a current according to the supplied analogue value flows from the data line PBL or NBL to the voltage line CVSS via the N-type FET N5 or N6. In the product operation memory cell 1, a current type product operation is executed, and a current type sum operation is executed in the data line PBL or NBL.

FIG. 12B is a graph showing the relationship between the input data supplied to the product operation memory cell and the current flowing from the data lines PBL, NBL to the product operation memory cell. For example, as shown in FIG. 2, the input data is supplied to the gate electrode of the N-type FET N7, and a current corresponding to the drain current flowing through the N-type FET N7 flows from the data line PBL to the voltage line CVSS. Since the drain current flowing through the FET N7 is nonlinear, the drain current becomes nonlinear with respect to the voltage as shown in FIG. 12B.

In the eighth embodiment, the analogue value supplied to the input wiring is adjusted so that the current flowing from the data lines PBL, NBL to the product operation memory cell becomes linear with respect to the voltage value represented by the input data ID[0] to ID[m]. This adjustment may be performed, for example, by adjusting the conversion characteristic of the D/A conversion circuit 48_2, or by adjusting the analog values outputted from the D/A conversion circuit 48_2 in the INP driver circuit 48_3. In this way, the multiplicand in the product operation can also be multi-valued.

According to the eighth embodiment, since the multiplicand in the product operation can also be multi-valued, the accuracy of learning and inference can be further improved.

Ninth Embodiment

In a ninth embodiment, an example of a memory cell column described in the eighth embodiment and an A/D conversion circuit corresponding to the memory cell column will be described.

Figure 13:
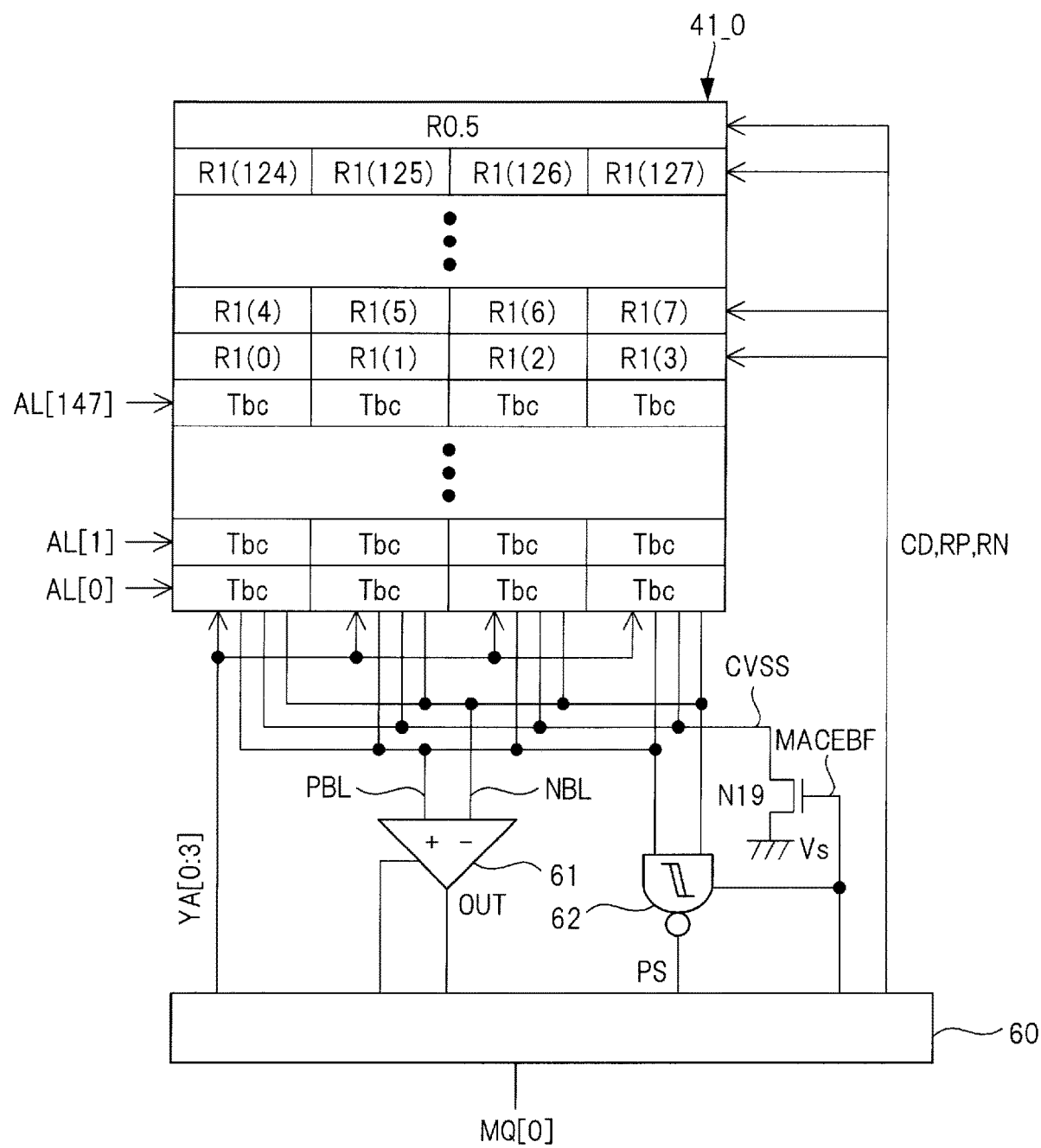
FIG. 13 is a diagram showing a configuration of a semiconductor device according to a ninth embodiment.

FIGS. 13 and 14 are diagrams showing the configuration of a semiconductor device according to the ninth embodiment. FIG. 13 shows one memory cell column and its associated parts. Specifically, the memory cell column 41_0 shown in FIG. 8A and its related portions are illustrated in FIG. 13A.

The memory cell column 41_0 comprises data lines PBL, NBL, a plurality of product operation memory cells Tbc connected to each of the data lines PBL, NBL, and two types of reference cells R1 and R0.5. In the example of FIG. 13, 128 reference cells R1 (0) to R1 (127) and one reference cell R0.5 are provided in the memory cell column 41_0 as reference cells R1. In FIG. 13, AL[0] to AL[147] represent input data supplied to the input wiring arranged to cross the memory cell column 41_0.

Figure 14A:
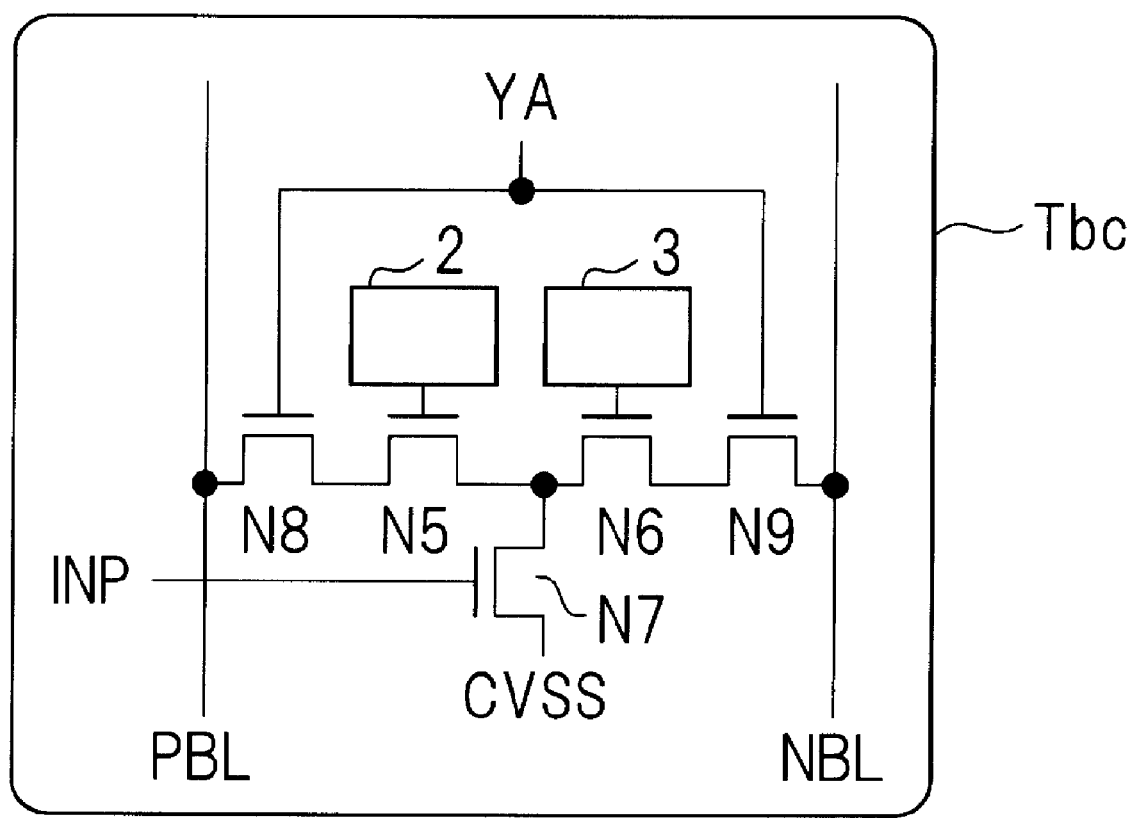
FIG. 14A-14D are diagrams showing a configuration of a semiconductor device according to a ninth embodiment.

As the product operation memory cell Tbc, a product operation memory cell shown in FIG. 14A is used. The configuration of the product operation memory cell shown in FIG. 14A is the same as that shown in FIG. 6, and therefore the explanation thereof is omitted.

In the memory cell column 41_0, four product operation memory cell are connected to the same input wiring. A column address for selecting one product operation memory cell Tbc from four product operation memory cells Tbc connected to the same input wiring is shown as a sign YA in FIG. 14A. In order to select one product operation memory cell from the four product operation memory cells Tbc, the column address YA is comprised of four bits YA[0:3]. In the product operation memory cell selected by the column address YA, the input data AL[0] to AL[147] supplied via the input wiring become the input data INP to be performed a product operation by the data stored in the selected product operation memory cell.

Figure 14B:
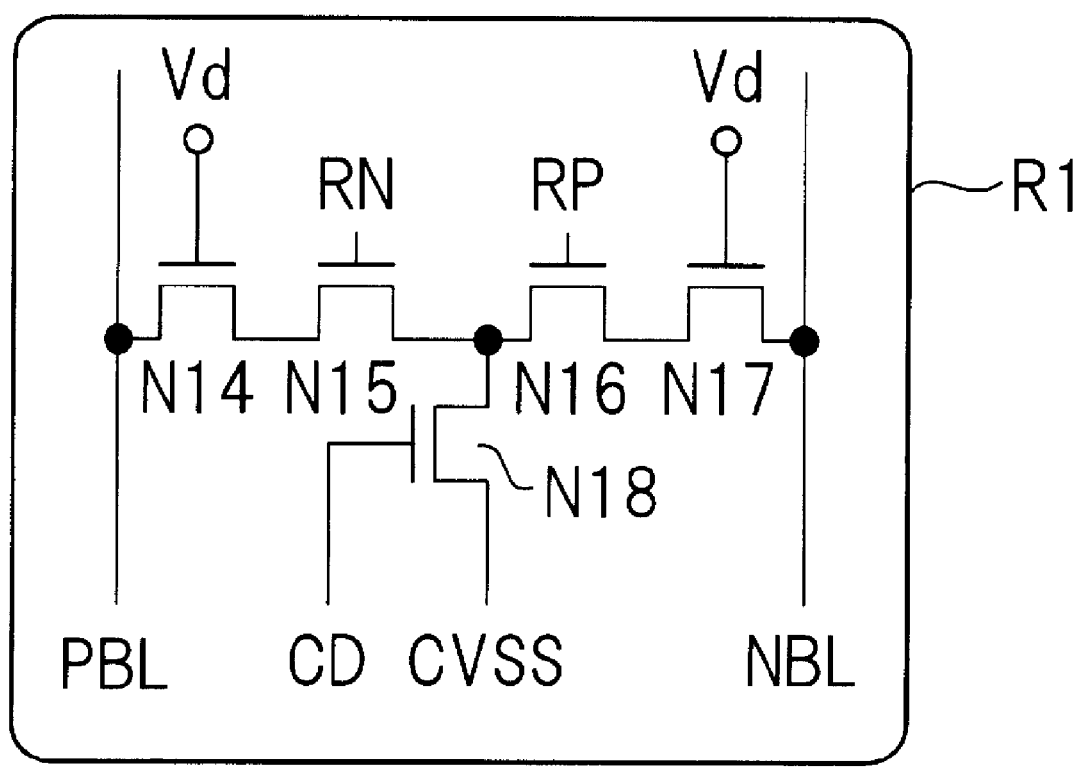

FIG. 14B shows a configuration of the reference cell R1. Similar to the product operation memory cell Tbc, the reference cell R1 includes N-type FETs N14 to N17 in which source-drain paths are connected in series between the data line PBL and the NBL, and an N-type FET N18 connected between the voltage line CVSS and a node connecting between the N-type FETs N15 and the N16 and. Reference cell R1 has a structure similar to the structure of the product operation memory cell Tbc. The difference is that instead of the column address YA, the power supply voltage Vd is supplied to the gate electrodes of the N-type FETs N14 and N17, selection signals RN, RP are supplied instead of the outputs of the memory cells 2 and 3, and a control signal CD is supplied instead of the input data INP. The reference cell R1 has a structure similar to the structure of the product operation memory cell Tbc, so that the reference cell R1 has a driving force equal to the driving force of the product operation memory cell Tbc (=1) with respect to the data lines PBL, NBL.

Figure 14C:
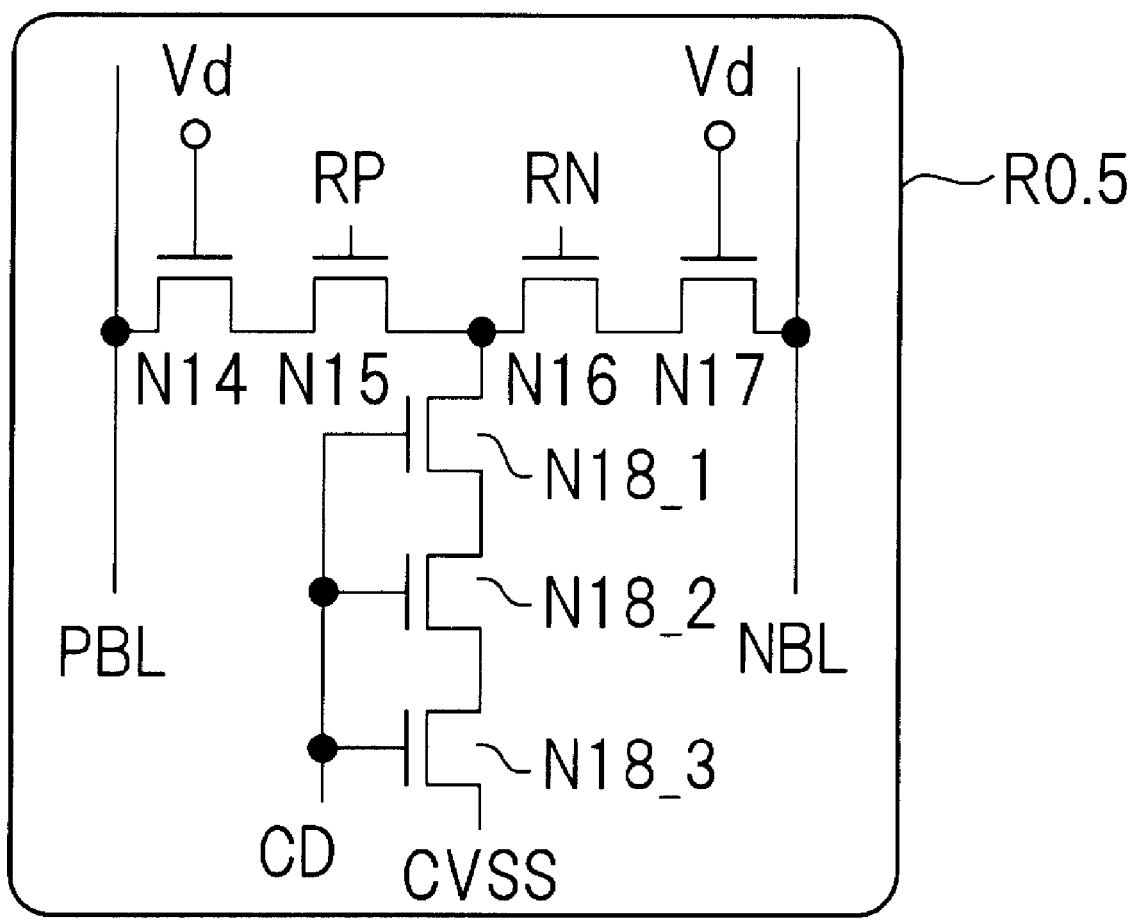

FIG. 14C shows a configuration of the reference cell R0.5. The reference cell R0.5 has a configuration similar to the reference cell R1. The difference is that, in the reference cell R0.5, the N-type FETs connected between nodes connecting between the N-type FET N15 and N16 and the voltage line CVSS is increased to N18_1 to N18_3. As a result, the driving force of the reference cell R0.5 with respect to the data lines PBL, NBL is, reference cell R1, in other words, half the driving force of the product operation memory cell Tbc (=0.5).

Returning to FIG. 13, a description will be given. In FIG. 13, reference numeral 60 denotes a control logic unit, 61 denotes a comparator circuit, 62 denotes a Schmitt trigger type NAND circuit, and N19 denotes an N-type FET. The data lines PBL, NBL are connected to a comparator circuit 61 and a Schmitt trigger type NAND circuit 62. The voltage line CVSS in the product operation memory cell Tbc and the voltage line CVSS in the reference cell R1 and R0.5 are connected to the ground voltage Vs through an N-type FET N19.

A comparison result OUT from the comparator circuit 61 and a control signal PS from the Schmitt trigger type NAND circuit 62 are supplied to the control logic unit 60. The control logic unit 60 outputs the column address YA[0:3], a control signal for controlling the comparator circuit 61, a product-sum operation enable signal MACEBF for controlling the N-type FET N19, selection signals RN, RP, and the control signal CD. As will be described later, an A/D conversion function is provided by the control logic unit 60 and the comparator circuit 61. That is, it can be considered that the control logic unit 60 and the comparator circuit 61 constitute an A/D conversion circuit. The result obtained by this A/D conversion circuit becomes the result of the product-sum operation, and is output as MQ output data MQ[0].

As shown in FIG. 2 and the like, the product operation memory cell Tbc stores data of ternary value. That is, the product operation memory cell Tbc stores any logical value of "+1", "0" or "−1". As the input data INP, binary data is supplied. That is, "0" or "1" is supplied to the product operation memory cell Tbc as the input data INP.

In the ninth embodiment, as shown in Equation (1), product-sum operation is calculated by separating the product sum value on the side of "+1" and the product sum value on the side of "−1". Here, MQ represents MQ output data as a result of the product-sum operation, INP(i) represents a logical value of the i-th input data INP, and Tbc(i, YA) represents a logical value stored in an i-th product operation memory cell and its column address is YA. Further, Tbcp(i) represents an i-th product operation memory cell storing the logical value "+1", and Tbcn(i) represents an i-th product operation memory cell storing the logical value "−1".

$$MQ=\Sigma\{INP(i) \times Tbc(i,YA)\}=\Sigma\{INP(i) \times Tbcp(i)\} - \Sigma\{INP(i) \times Tbcn(i)\} \quad (1)$$

Here, Tbcp(i) is represented by Equation (2), and Tbcn is represented by Equation (3).

$$Tbcp(i) = \begin{cases} 1, & Tbc\ (i, YA) > 0 \\ 0, & Tbc\ (i, YA) \leq 0 \end{cases} \quad (2)$$

$$Tbcn(i) = \begin{cases} 0, & Tbc\ (i, YA) \geq 0 \\ 1, & Tbc\ (i, YA) < 0 \end{cases} \quad (3)$$

Figure 15A:
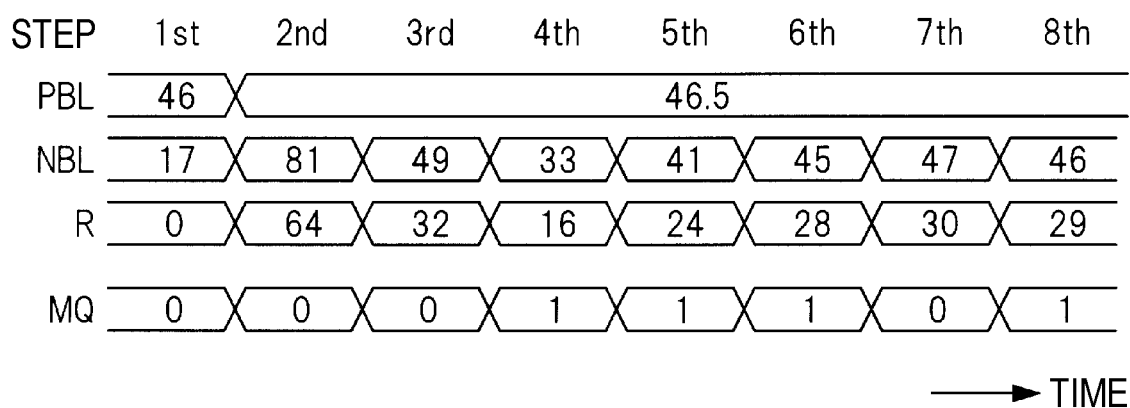
FIGS. 15A and 15B are timing diagrams for explaining an A/D conversion according to the ninth embodiment.
Figure 15B:
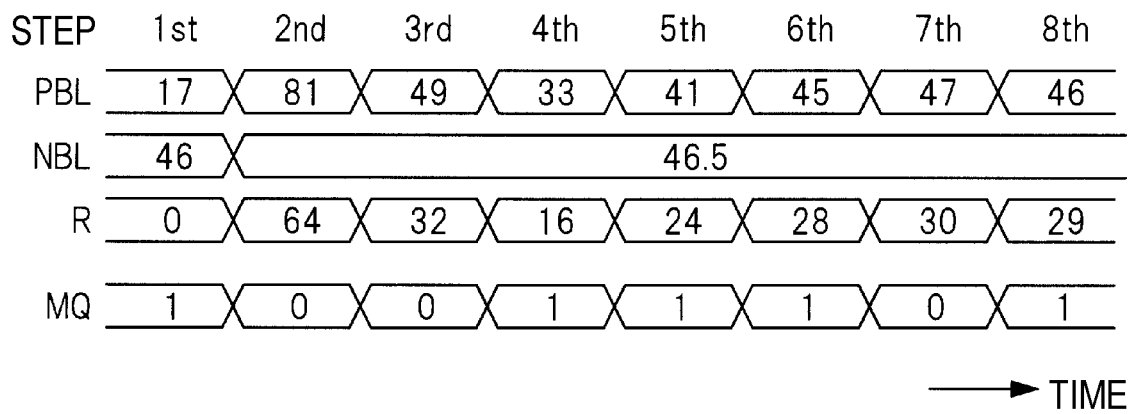

<A/D conversion> Next, an operation of the A/D conversion will be described using an example. In the ninth embodiment, A/D conversion is performed in eight steps. FIG. 15 is a timing chart for explaining the A/D conversion according to the ninth embodiment. In FIGS. 15A and 15B, the horizontal axis represents time. In addition, 1st to 8th indicate the eight steps described above.

By way of the product-sum operation, it is assumed that the product sum value on the side of "+1" is "46" and the product sum value on the side of "−1" is "17". The current in the data line PBL indicates the product sum value "46" and the current in the data line NBL indicates the product sum value "17". In this instance, the difference of the product sum value is "29". The MQ output data MQ[0] corresponding to the difference is output from the control logic unit 60.

In FIG. 15A, in the first step 1st, the comparator circuit 61 compares the currents of the data lines PBL, NBL. Since "46">"17", the control logic unit 60 outputs the logical value "0" indicating the sign "+" as MQ output data. Since the current of the data line PBL is larger, the control logic unit 60 sets the selection signal RP to the high level and the selection signal RN to the low level. Further, the control logic unit 60 connects the reference cell R0.5 to the data line PBL, and connects the specified number of reference cells to the data line NBL. The specified number here is "64", which is half the number of 128 reference cell R1.

In the second step 2nd, the control logic unit 60 turns the N-type FETs N18_1 to N18_3 in the reference cell R0.5 connected to the data line PBL into the on state by the control signal CD. In addition, the control logic unit 60 turns the N-type FET N18 of the 64 reference cells R1 connected to the data line NBL into the on state in response to the control signal CD. The value in the data line PBL is 46+0.5=46.5, and the value in the data line NBL is 17+64=81. The comparator circuit 61 compares "46.5" with "81". As a result of the comparison, since the value of the data line NBL becomes large, the control logic unit 60 outputs the logical value "0" as the MQ output data MQ[0].

In the third step 3rd, the control logic unit 60 designates "32" which is half of "64" as the designated number, and turns the N-type FETs N18 and N18_1 to N18_3 into the on state by the control signal CD. Thus, the value of the data line PBL is "46.5" as before, but the value of the data line NBL is 17+32=49. Since the comparison by the comparator circuit 61 determines that the value of the data line NBL is large, the control logic unit 60 outputs the logical value "0" as the MQ output data MQ[0].

Also in the fourth step 4th, the control logic unit 60 specifies the number of the reference cells R1 and outputs the control signal CD, similarly to the third step 3rd. However, in the fourth step 4th, half of the number "16" is specified as the number of reference cells R1. Because of this, the comparator circuit 61 compares the value "46.5" in the data line PBL with the value 17+16=33 in the data line NBL. In the fourth step 4th, since the value of the data line PBL is larger than the value of the data line NBL, the control logic unit 60 outputs the logical value "1" as the MQ output data MQ[0].

In the fifth step 5th, the control logic unit 60 designates "24" as the number of the reference cells R1. As a result, the value of the data line NBL becomes 17+24=41, and the comparison comparator circuit 61 determines that the value of the data line PBL is larger than the value of the data line NBL, so that the control logic circuit 60 outputs the logical value "1" as the MQ output data MQ[0].

Thereafter, from the sixth step 6th to the eighth step 8th, the data line PBL and the data line NBL are compared while changing the number specifying the reference cells R1 to "28", "30" and "29". By comparing, when the value of the data line PBL is larger than the value of the data line NBL, the control logic unit 60 outputs the logical value "1" as the MQ output data MQ[0], and when the value of the data line NBL is larger than the value of the data line PBL, the control logic unit 60 outputs the logical value "0" as the MQ output data MQ[0].

The result of the product-sum operation is converted into serial 8 bits. The first bit is the sign bit, and following the sign bit, sequential bits are outputted from the most significant bit to the least significant bit.

Next, referring to FIG. 15B, an exemplary case in which the sign bit is "−" will be described. Here, the case where the product sum value on the "+1" side is "17" and the product sum value on the "−1" side is "46", that is, the case where the value in the data line PBL is "17" and the value in the data line NBL is "46" will be described. Since "17"<"46", the control logic unit 60 outputs the logical value "1" representing the sign "−" as MQ output data MQ[0], in the first step 1st. Since the value in the data line NBL is large, the selection signal RP is set to the low level and the selection signal RN is set to the high level. Further, the reference cell R0.5 is connected to the data line NBL, and the specified number of reference cells R1 are connected to the data line PBL.

The control logic unit 60 performs similar operation as in FIG. 15A after the second step 2nd, but since the sign is "−", the control logic unit 60 outputs an inverted logical value as the MQ output data MQ[0]. That is, the control logic unit 60 outputs the logical value "0" as the MQ output data MQ[0] when the value of the data line PBL is larger than the value of the data line NBL, and outputs logical value "1" as the MQ output data MQ[0] when the value of the data line NBL is larger than the value of the data line PBL. As a result, as shown in FIG. 15B, the serially converted digital signal is output as MQ output data MQ[0].

As described above, in the ninth embodiment, the difference between the data lines PBL, NBL is searched by using a binary division method, and the result is converted into the serial digital signal and outputted.

In the ninth embodiment, when the data length of the MQ output data MQ[0] shown in FIG. 15 becomes the data length desired by a user, the processing can be terminated. This makes it possible to reduce the power and time required for wasteful A/D conversion.

Figure 14D:
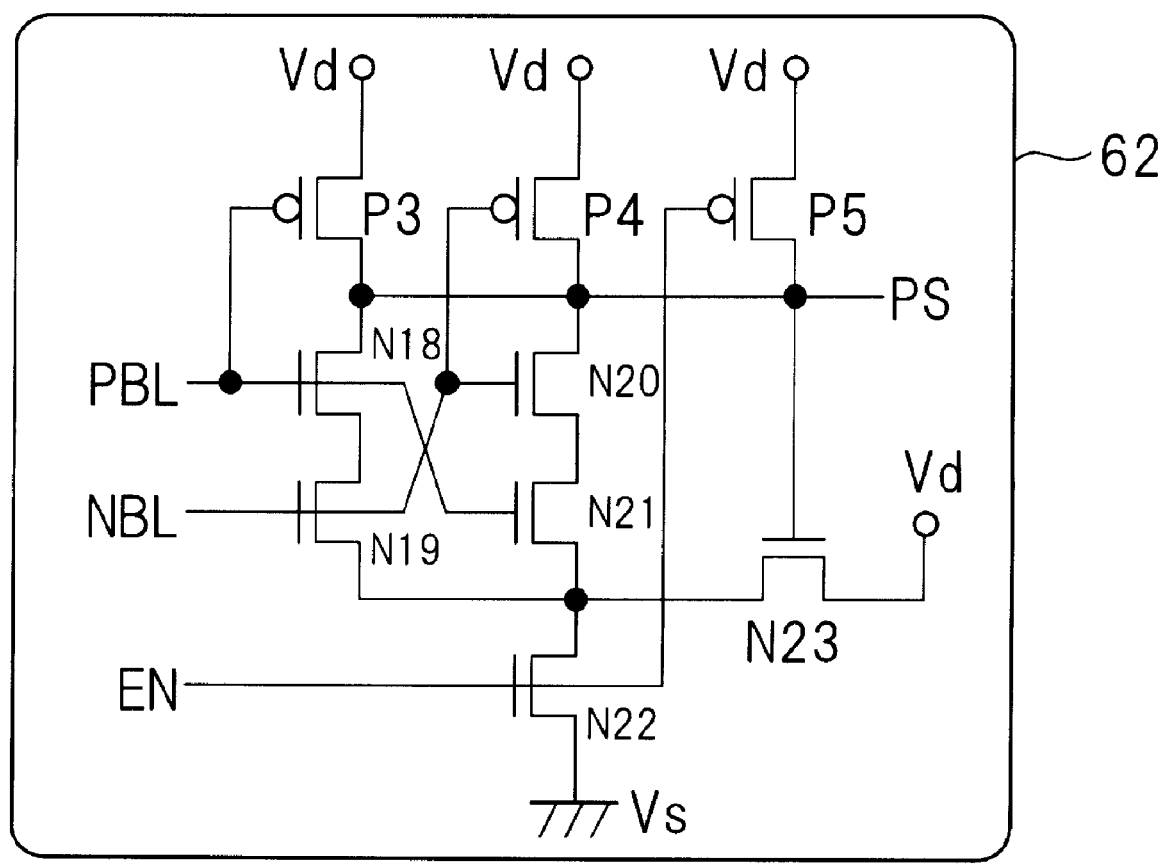

In the ninth embodiment, in order to further reduce the power consumption, a Schmitt trigger type NAND circuit 62 is provided. The Schmitt trigger type NAND circuit 62 has a configuration as shown in FIG. 14D. That is, the Schmitt trigger type NAND circuit 62 is comprised of P-type FETs P3 to P5 and N-type FETs N18 to N23.

The Schmitt trigger type NAND circuit 62 functions as a circuit for detecting the case where the AND on the "+1" side is "0" and the AND on the "−1" side is "0". In the machine learning and inference, as a result of the product-sum operation, there are many states in which the product sum values are "0" on both the "+1" side and the "−1" side. In the configuration according to the ninth embodiment, when the product sum value is "0", there is no pass for drawing the charge of the data lines PBL, NBL toward the ground voltage Vs. Therefore, the voltages of the data lines PBL, NBL are maintained at the power supply voltage Vd. By using the Schmitt trigger type NAND circuit 62 having a logical threshold increased toward the power supply voltage Vd, it is possible to detect that both the data lines PBL and NBL are at the level of power supply voltage Vd. The detection result is notified to the control logic unit 60 by the control signal PS. The Schmitt trigger type NAND circuit 62 is controlled by the product-sum operation enable signal MACEBF together with the N-type FET N19. That is, when the N-type FET N19 is turned to the on state, the Schmitt trigger type NAND circuit 62 is controlled to be able to operable.

When the control signal PS notifies that both the data lines PBL and NBL are at the level of power supply voltage Vd, the control logic unit 60 outputs the logical value "0" as the MQ output data MQ[0] without performing the A/D conversion operation described above. Thus, the power consumption can be further reduced.

In the ninth embodiment, for example, 148 pieces of input data AL[0] to AL[147] are supplied to the input wiring substantially simultaneously. In the memory cell column 41_0, 148 product operations are performed substantially simultaneously, and a sum operation of the results of 148 product operations is also performed substantially simultaneously.

According to the ninth embodiment, since the user can freely change the data length of the MQ output data MQ[0], it is possible to increase a degree of freedom of adjustment relating to a trade-off between the power consumption and a performance. Further, when the AND becomes "0", the logical value "0" is output as the MQ output data without performing the A/D conversion operation, so that the power consumed can be reduced.

Tenth Embodiment

Figure 16A:
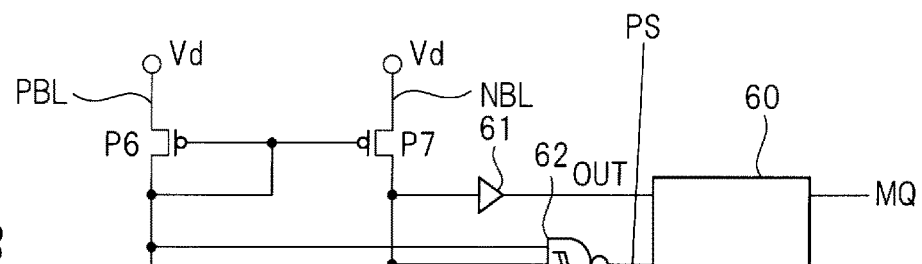
FIGS. 16A and 16B are diagrams showing a configuration of a semiconductor device according to a tenth embodiment.

FIGS. 16 and 17 are diagrams showing a configuration of a semiconductor device according to a tenth embodiment. FIG. 15A is similar to FIG. 13, and therefore mainly explains the difference. In FIG. 16A, the source-drain paths of the P-type FETs P6 and P7 are connected between the data lines PBL, NBL and the power supply voltage Vd, and constitute bias circuits for biasing the data lines PBL, NBL. In FIG. 16A, the comparator circuit 61 shown in FIG. 13 is shown as a buffer circuit 61.

Figure 16B:
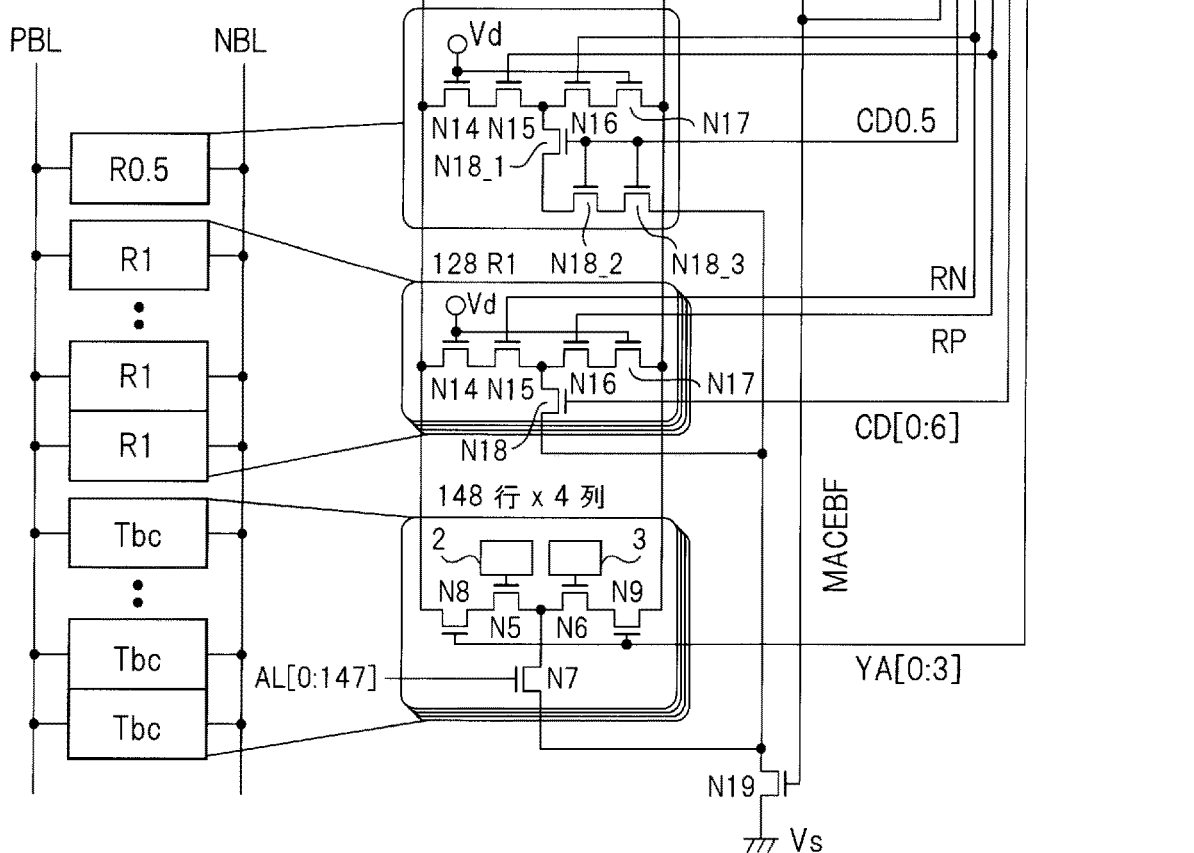

As shown in FIGS. 16A and 16B, to the memory cell, 148 rows×4 columns=592 product operation memory cells Tbc, 128 reference cells R1, and 1 reference cell R0.5 are connected to the data lines PBL, NBL.

Figure 17A:
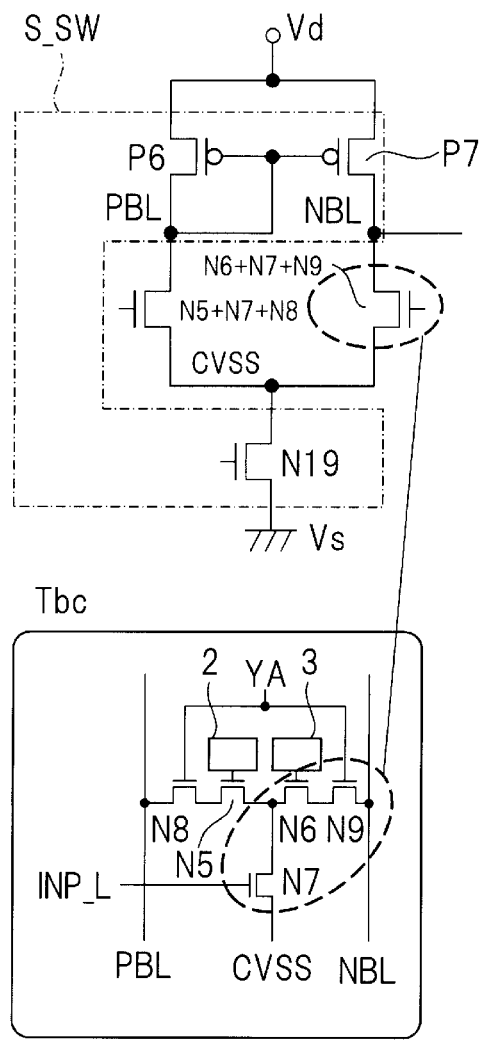
FIGS. 17A and 17B are diagrams for explaining the tenth embodiment.

FIG. 17 is a diagram for explaining the tenth embodiment. FIG. 17A shows a configuration of a comparator. The comparator includes a pair of N-type FETs, a load, and a current source. The pair of N-type FETs form a differential FET, and the comparator amplifies and outputs a potential difference at the gate electrodes of the differential FET. In the tenth embodiment, FETs constituting switches in the product operation memory cell Tbc, the reference cell R1, R0.5 are used as differential FETs of the comparator. To explain the product operation memory cell Tbc as an example, as indicated by a broken line in FIG. 17A, the N-type FETs N6, N7, and N9 constituting the switch function as one FET of the pair of differential FETs, and the N-type FETs N5, N7, and N8 constituting the switch function as the other FET of the pair of differential FETs. The P-type FETs P6, P7, connected to the data lines PBL, NBL can be regarded as a current supply unit for supplying a current to the differential FET, and the N-type FET N19 can be regarded as a switching circuit for the differential FET. In the tenth embodiment, a circuit comprising the P-type FET P6, P7 and the N-type FET N19 is referred to as a source switch S-SW.

Although an example in which some of the FETs constituting the product operation memory cell function as FETs constituting the comparator, the same applies to the reference cells R1, R0.5. In the reference cell R1, the N-type FETs N16 to N18 function as one differential FET, and the N-type FETs N14, N15, and N18 function as the other differential FET. In the reference cell R0.5, the N-type FETs N16, N17 and N18_1 to N18_3 function as one differential FET, and the N-type FETs N14, N15 and N18_1 to N18_3 function as the other differential FET.

As a result, when the product sum value on the "+1" side or the "−1" side is small, the comparator can amplify a difference potential between the data line PBL, NBL, and an operation margin can be widened. In addition, as shown in FIG. 17B, by arranging the source switches S-SW in a distributed manner, a malfunction due to data bias of the data line PBL, the NBL, and the voltage line CVSS can be reduced.

As shown in FIG. 16A, the reference cell R0.5 is controlled by a control signal CD0.5, and the reference cell R1 is controlled by the seven control signals CD[0:6]. Here, one reference cell R1 is connected to the control signal CD[0], two reference cells R1 are connected to the control signal CD[1], and four reference cells R1 are connected to the control signal CD[2]. In addition, 8 reference cells R1 are connected to the control signal CD[3], 16 reference cells R1 are connected to the control signal CD[4], 32 reference cells R1 are connected to the control signal CD[5], and 64 reference cells R1 are connected to the control signal CD[6]. That is, the control signal CD[0:6] is weighted.

Figure 17B:
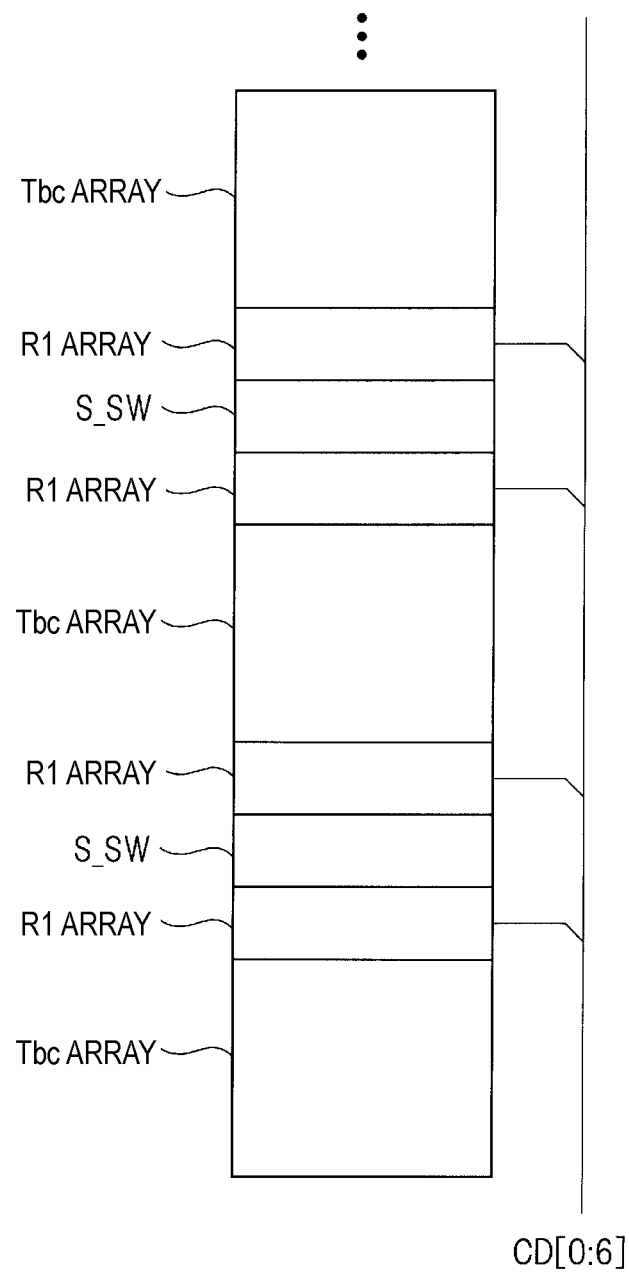

In FIG. 17B, Tbc arrays configured by the product operation memory cells Tbc and R1 arrays configured by the reference cells R1 can also be considered to be distributed and arranged. As described above, by the distributed arrangement, also in the Tbc array and the R1 array, it is possible to reduce the malfunction due to the data bias.

According to the tenth embodiment, when the product sum values on the "+1" side and the "−1" side are small, the difference potentials of the data lines PBL, NBL can be amplified, and the operation margin can be widened. In addition, a malfunction can be reduced by distributing the source switches S-SW, the Tbc arrays, and the R1 arrays.

Eleventh Embodiment

In the ninth embodiment, an example in which the user can arbitrarily change the data length of the MQ output data MQ[0] is shown. In other words, an example in which the user arbitrarily compresses the data length of the MQ output data MQ[0] has been described as the ninth embodiment. In an eleventh embodiment, a configuration in which other data compression can be selected by a user is provided.

FIG. 18 is a diagram for explaining an A/D conversion according to the eleventh embodiment.

Figure 18A:
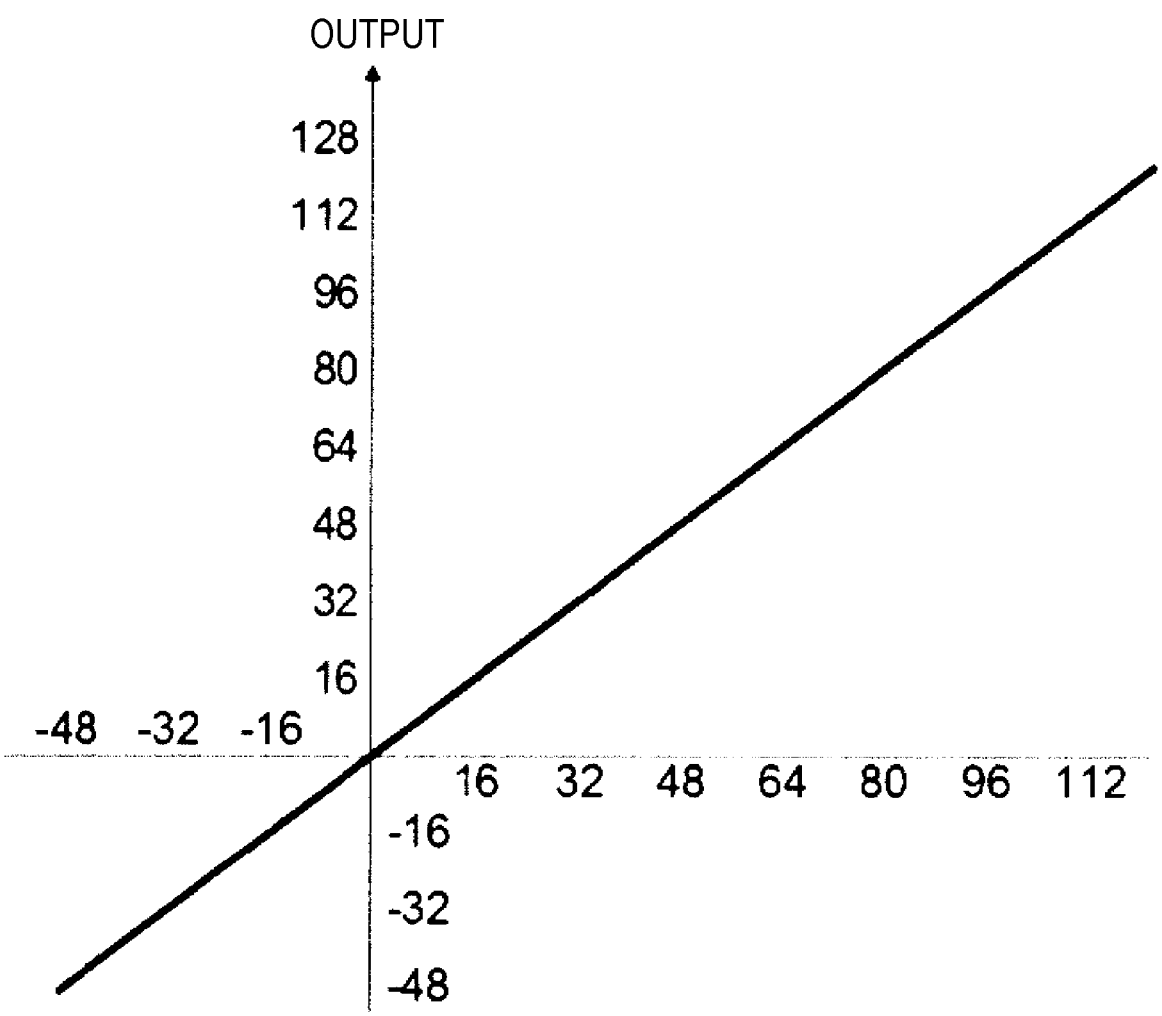

Similar to the explanation in the ninth embodiment, it is assumed that the A/D conversion circuit converts into 8 bits. When a data length of a maximum resolution is 8 bits, the value of the result of product-sum operation and the output value represented by the MQ output data MQ[0] correspond one-to-one as shown in FIG. 18A.

Figure 18B:
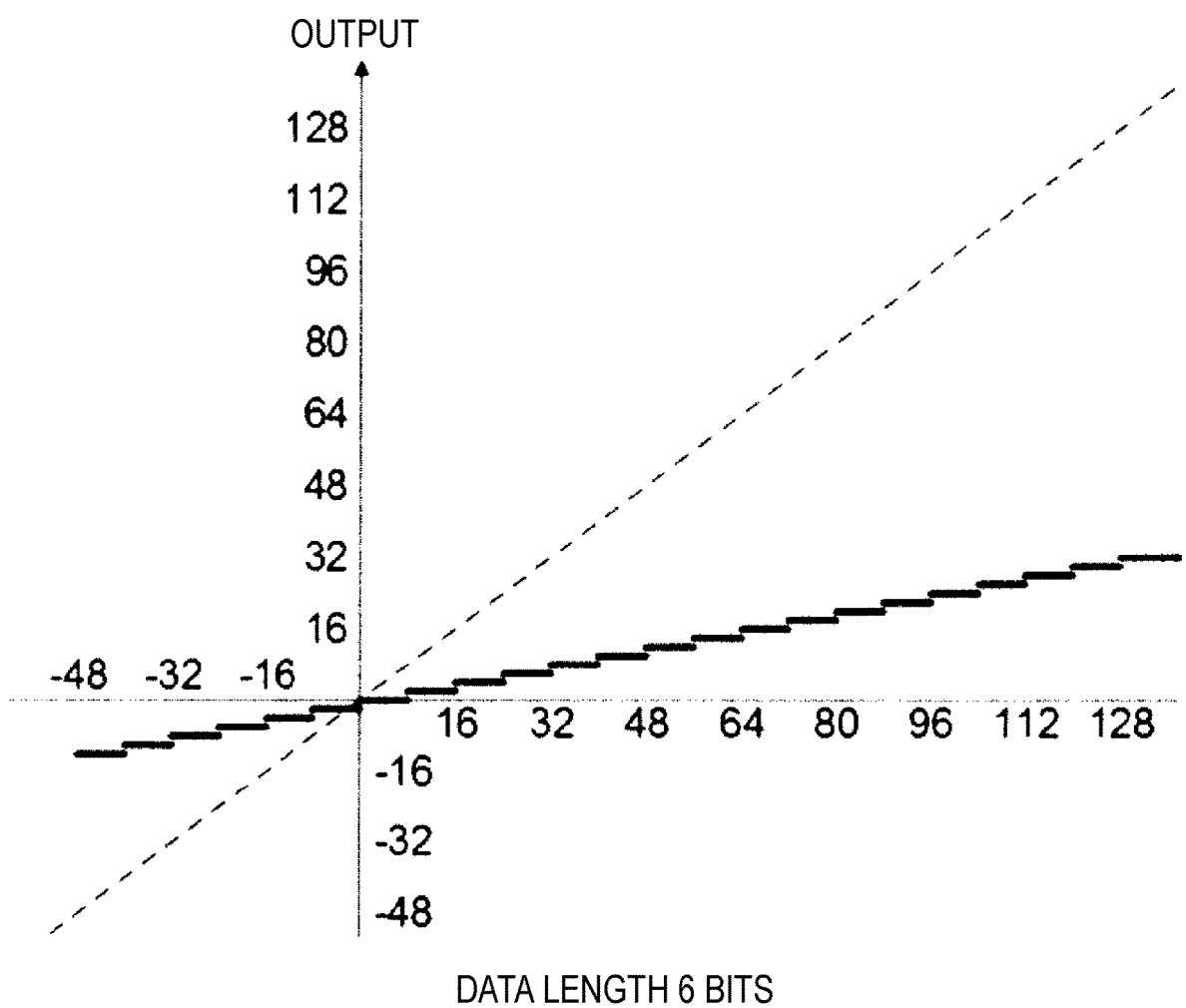

On the other hand, as described in the ninth embodiment, when the A/D conversion operation is stopped halfway, for example, in a sixth cycle (corresponding to the sixth step of FIG. 15:6th), the value represented by the 6-bit output value range from "−31" to "+31". The state at this time is shown in FIG. 18B. In FIG. 18B, the broken line indicates a case of the maximum resolution, and when stopping at the sixth cycle, the state becomes that the true value represented by maximum resolution is compressed to ¼, as indicated by the solid line. In other words, the characteristic of the A/D conversion circuit is expressed by a function that outputs the state compressed to ¼ with respect to a true value.

However, in some applications, up to a predetermined value, a function may be desired as the A/D conversion such that a value equal to the true value is output. For example, when six cycles are specified, as shown in FIG. 18C, a function may be desired in which the range of "−31" to "+31" becomes equal to the true value and becomes constant outside the range.

Figure 18C:
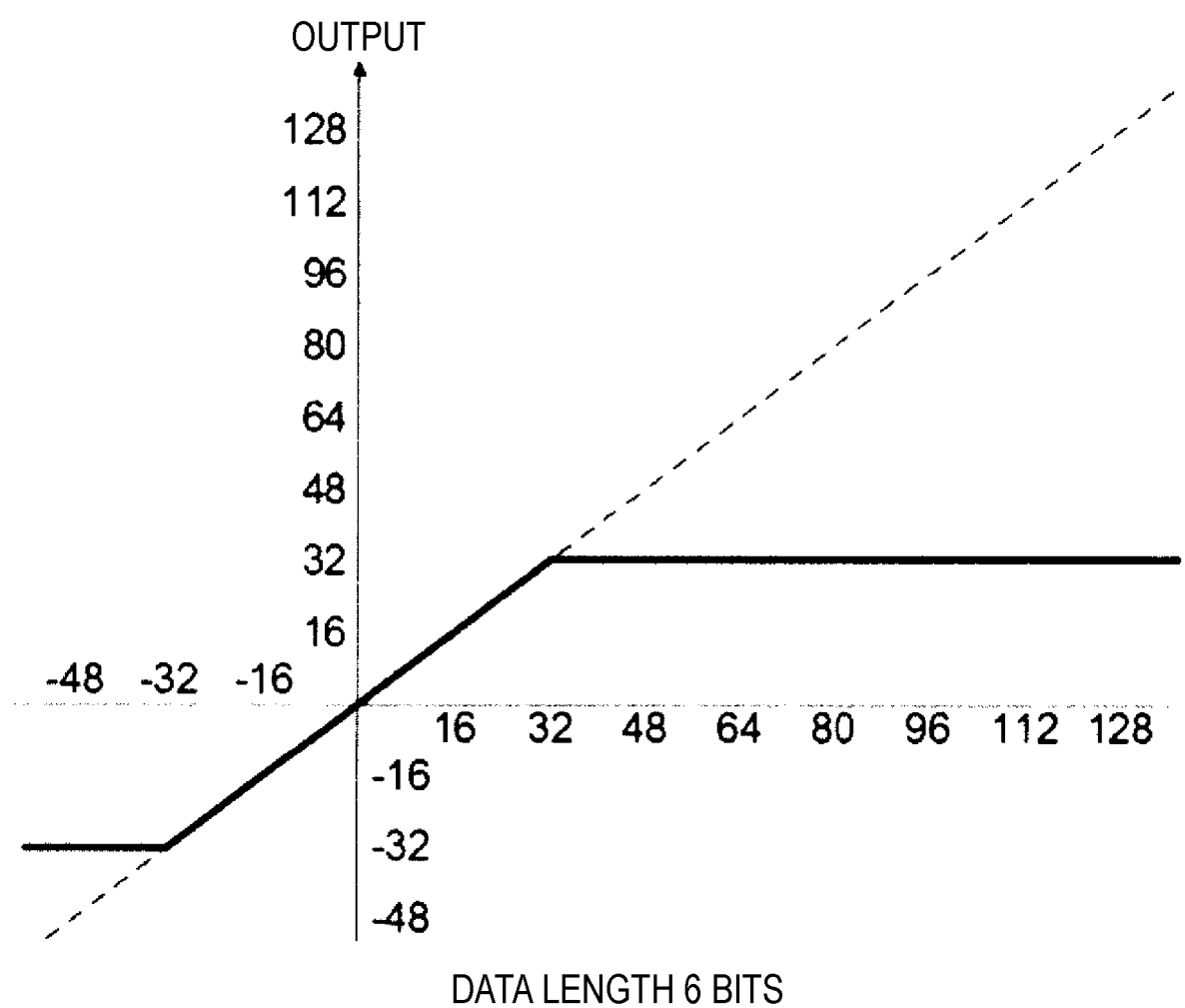

FIG. 18D shows the case of FIG. 18B and the case of FIG. 18C by exemplifying the case where the output value is "+38". In FIG. 18D, condition 1 indicates the case of specifying up to the seventh bit to indicate true values, and condition 2 indicates the case of specifying the compressing as in FIG. 18B. The condition 1 has true values up to the seventh bit, whereas the condition 2 has a value of ½ of the true value at the seventh bit. Since these changes depending on the application, it is necessary to be able to select one of them.

Figure 19:
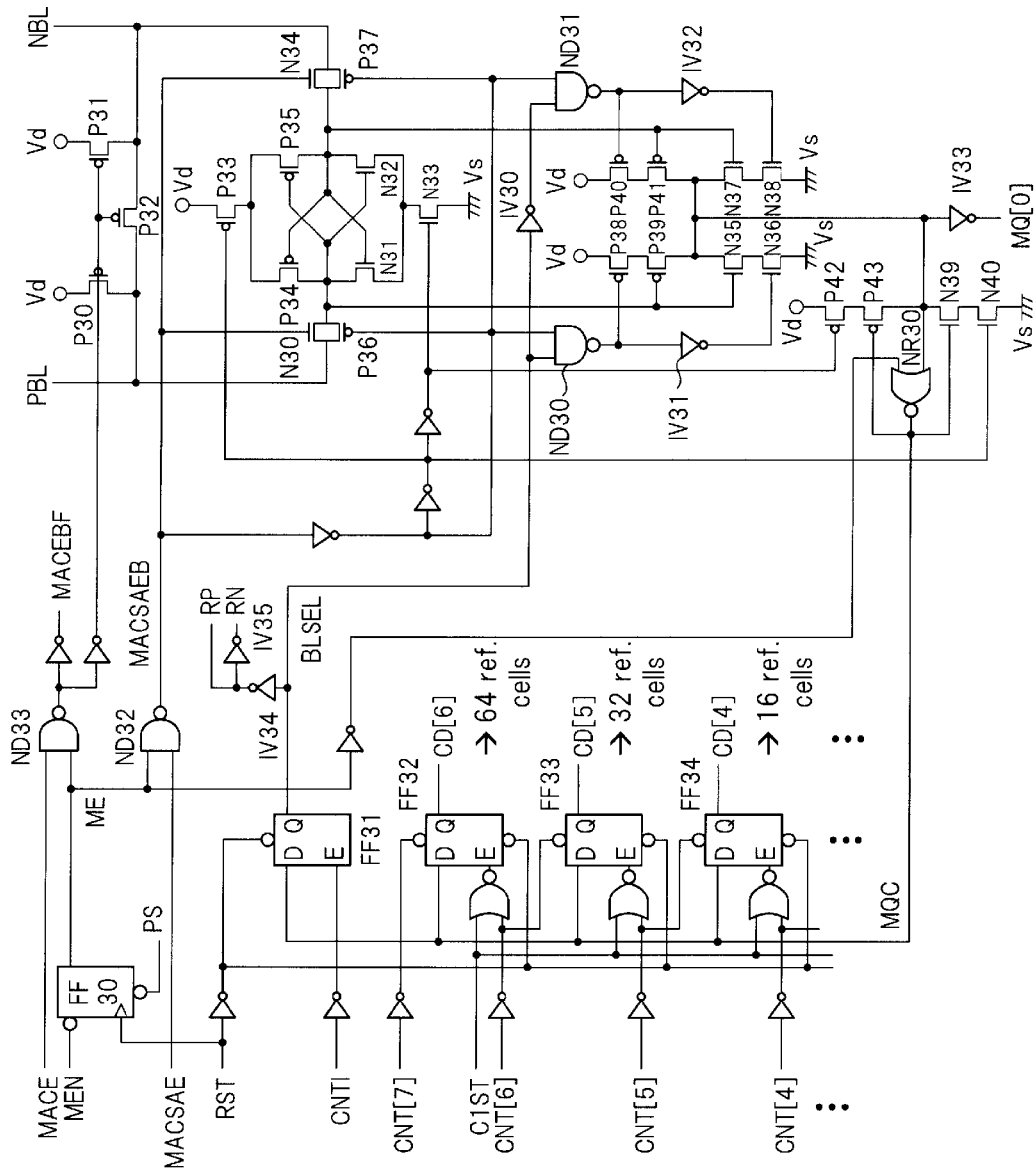
FIG. 19 is a schematic diagram showing a configuration of a semiconductor device according to the eleventh embodiment.
Figure 20A:
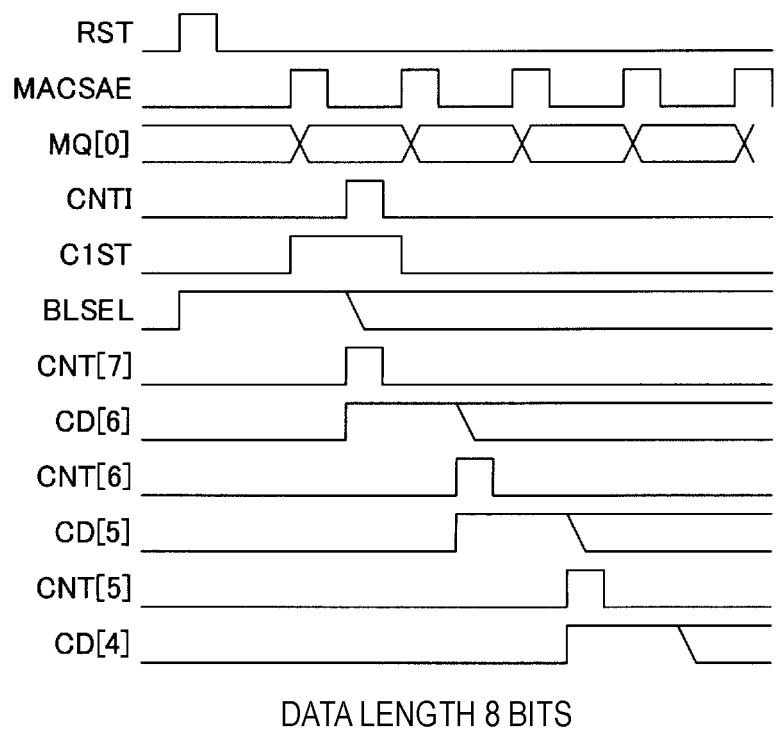
FIGS. 20A and 20B are timing diagrams of a semiconductor device according to the eleventh embodiment.
Figure 20B:
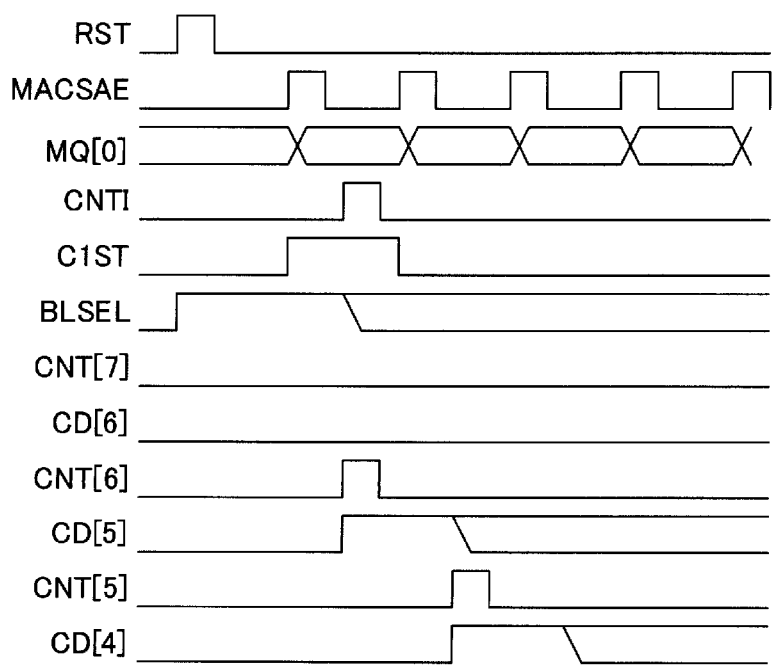

FIG. 19 is a schematic diagram showing the configuration of a semiconductor device according to the eleventh embodiment. FIG. 19 shows a circuit of the part relating to a set of data lines PBL, NBL. FIG. 20 is a timing chart of the semiconductor device according to the eleventh embodiment. Here, FIG. 20A shows a case where the data length is specified to be 8 bits, and FIG. 20B shows a case where the data length is set to be 7 bits and the conversion as shown in FIG. 18C is specified.

The pair of data lines PBL, NBL are connected to a precharge circuit formed by P-type FETs P30 through P32. The data lines PBL, NBL are connected to a differential sense amplifier via a pair of transfer switches. The pair of transfer switch is comprised of N-type FETs N30, N34 and P-type FETs P36, P37, which are controlled by a differential sense amplifier activation signal MACSAFB. The differential sense amplifier is comprised of N-type FETs N31 to N33 and P-type FETs P33 to P33, and when the P-type FET P33 and N-type FET N33 are turned to the on state by the differential amplifier activation signal MACSAEB, the differential sense amplifier amplifies and latches the potential difference between the data lines PBL, NBL supplied via the pair of transfer switches. The potential difference amplified by the comparator described in the tenth embodiment is supplied to the data lines PBL, NBL.

An output of the differential sense amplifier is supplied to a switching selector comprised of NAND circuits ND30, ND31, inverter circuits IV30 to IV32, P-type FETs 38 to P41, and N-type FETs N35 to N38. Depending on whether a control signal BLSEL supplied to the NAND circuit ND30, ND31 is at the high level or the low level, the output of the NAND circuit ND30 or ND31 becomes at the low level. For example, when the output of the NAND circuit ND30 becomes the low level, a voltage in the amplified data line PBL is selected and outputted the MQ output data MQ[0] through the inverter circuit IV33. On the other hand, when the output of the NAND circuit ND31 is at a low level, the voltage of the amplified data line NBL is selected, and the selected voltage is output as MQ output data MQ[0] through an inverter circuit IV33. This is because, as described in the ninth embodiment, the inversion occurs depending on whether the sign is "+" or "−".

An output of the switching selector is latched by a latch circuit comprised of a NOR circuit NR30, a P-type FET P42, P43, and an N-type FETs N39, N40. The logical value of the MQ output data MQ[0] is held by the latch circuit, and the output of the latch circuit is supplied to the latch circuits FF31 to FF34 as a control signal MQC.

The product-sum operation mask signal MEM is inverted and latched by the latch circuit FF30 to become an inverted mask signal ME. The NAND circuit ND32 forms a differential amplifier activation signal MACSAEB by the inverted mask signal ME and a differential sense amplifier control signal MACSAE. Furthermore, the NAND circuit ND33 forms a product-sum operation enable signal MACEBF based on the inverted mask signal ME and a product-sum operation mode enable signal MACE. The precharge circuit is controlled by the control signal having the same phase as the phase of the product-sum operation enable signal MACEBF.

The latch circuits FF32 to FF34 generate a control signal CD for determining the number of the reference cells R1 to be turned to the on state. Although the control signal CD is 7 bits, FIG. 19 shows only latch circuits that generate CD[4] to CD[6], which are 3 bits of the control signal CD.

In FIG. 20A, first, the reset signal RST is set to the high level in order to set an initialization state. As a result, the product-sum operation mask signal MEM is inverted and latched by the latch circuit FF30. In addition, the latch circuits FF31 to FF34 are reset. Next, the differential sense amplifier control signal MACSAE is changed to the high level. Based on this, the potential difference between data lines PBL and NBL is latched by the differential sense amplifier. At this time, since the latch circuit FF31 is reset, the control signal BLSEL becomes the high level.

Therefore, when the state latched by the differential sense amplifier at this time is as follows: a product sum value on the side of "+1"> a product sum value on the side of "−1" (voltage of the data line PBL> voltage of the data line NBL), the logical value "0" is outputted as the MQ data.

Thereafter, when the control signal CNT1 is asserted, the control signal BLSEL, which is the output of the latch circuit FF31, becomes low level, and a high level selection signal PR and a low level selection signal PN are generated by the inverter circuits IV34, IV35. Since the MQ output data is output from the data line NBL side, the logical value "0" is output when the product sum value on the "+1" side<the product sum value on the "−1" side. With this, a control signal CNT[7] is asserted, and a control signal CD[6] becomes high level. By the control signal CD[6] being the high level, 64 reference cells R1 become the on state. At the next timing, the control signal CNT[6] is asserted, and a control signal CD[5] becomes the high level. As a result, 32 reference cells R1 are in the on state. As described above, by asserting the control signals CNT[7] to CNT[4], the logical value corresponding to the product sum value can be obtained while adjusting the number of the reference cells R1 turned to the on state.

Next, a case where the data length is reduced to 7 bits will be described with reference to FIG. 20B. The conversion as shown in FIG. 18C can be realized by asserting from a desired control signal CNT[n] without asserting the control signal CNT[7].

More specifically, the control signal CNT[6] is asserted together with the control signal CNTI in a timing when the sign bit is outputted after the initialization is finished. The control signal CNT[6] is also connected to the enable E of the latch circuit FF32 for outputting the control signal CD[6], but by setting the control signal C1ST to logical value "1" only for the first time, the latch circuit FF32 for the control signal CNT[6] is prevented from operating. Thus, the control signal CD[6] maintains the low level. As a result, the resolution becomes from "−63" to "+63", and a value equal to the true value is output up to 7 bits in the data length in the same manner as shown in FIG. 18C. As described above, the data length of the MQ output data MQ[0], which is outputted, can be changed by the user, and the data length is variable.

The control signal PS described in the ninth embodiment is connected to a reset terminal of the latch circuit FF30. Therefore, when the Schmitt trigger type NAND circuit 62 shown in FIG. 14D outputs the control signal PS, the inverted mask signal ME output from the latch circuit FF30 becomes low level. As a result, the product-sum operation enable signal MACEBF is turned to be the low level, and the product-sum operation is not performed. When the inverted mask signal ME is set to the low level, the latch circuit for the MQ output data including the P-type FET P43 and the NOR circuit NR30 is reset. That is, the P-type FET P43 is turned to the on state, the high level is supplied from the latch circuit for the MQ output data to the inverter circuit IV33, and the MQ output data is fixed to the level logical value "0" of the low level.

According to the eleventh embodiment, since the user can freely change the length of the output data, the degree of freedom of adjustment of the trade-off between the power and the performance is increased. In addition, whether or not the result of product-sum operation in the product operation memory cell connected to a pair of data lines is logical value "0" is detected by the Schmitt trigger type NAND circuit 62, and when it is "0", the control signal PS sets the MQ output data to a predetermined logical value and the A/D conversion operation is not executed, so that the power consumption can be reduced.

Twelfth Embodiment

Figure 21:
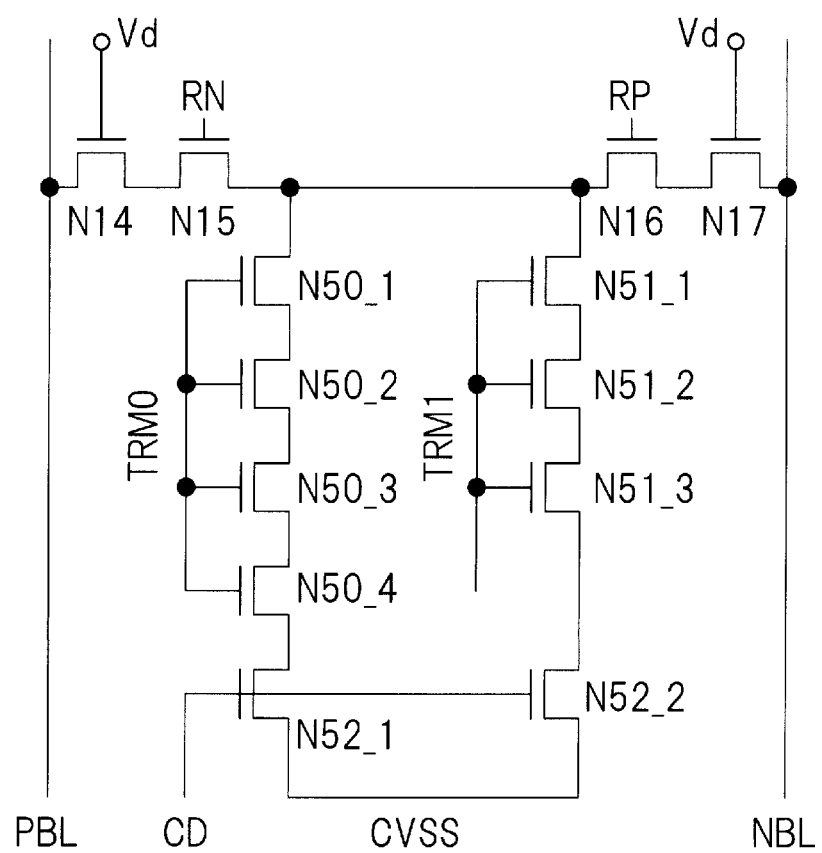
FIG. 21 is a circuit diagram showing a configuration of a reference cell according to a twelfth embodiment of the present invention.

FIG. 21 is a circuit diagram showing a configuration of a reference cell according to a twelfth embodiment. As described with reference to FIG. 14, the reference cell R1 has a configuration similar to that of the product operation memory cell. Therefore, the characteristic of the reference cell R1 also varies in accordance with the variation of the characteristic of the product operation memory cell Tbc. For the reference cell R1, therefore, there is less need to account for variations in characteristic.

On the other hand, the reference cell R0.5 is set such that the current flowing by connecting the FETs in series is restricted and half of the current of the product operation memory cell flows. Therefore, if the characteristics of the FETs connected in series vary due to manufacturing variations, there is a fear that the current flowing through the reference cell R0.5 does not correspond to half the current of the product operation memory cell. In the twelfth embodiment, N-type FETs N18_1 to N18_8 shown in FIG. 14C are changed to N-type FETs N50_1 to N50_4, N51_1 to N51_ and N52_1 to N52_2 as shown in FIG. 21. Here, the control signal CD is supplied to the gate electrodes of the N-type FETs N52_1 and N52_2. On the other hand, the gate electrodes of the N-type FETs N50_1 to N50_4 are connected to a trimming terminal TRM0 for a current adjustment, and the gate electrodes of the N-type FETs N51_1 to N51_3 are connected to a trimming terminal TRM1 for a current adjustment.

Trimming terminal TRM0 or/and TRM1 are connected to the gate electrodes of, for example, N-type FETs N52_1 and N52_2 so that the current flowing through the reference cell R0.5 is half the current flowing through the product operation memory cell Tbc. The trimming terminals TRM0, TRM1 can be considered terminals that modify the characteristic of the reference cell R0.5.

According to the twelfth embodiment, it is possible to reduce the influence of manufacturing variations.

FIG. 22 shows external terminals of the semiconductor device according to the first to twelfth embodiments. Although the semiconductor devices related to first to twelfth embodiments have a large number of external terminals, only the external terminals related to the signals described in first to twelfth embodiments are representatively shown in FIG. 22. FIG. 22 shows external terminal names, their number, input/output distinctions and functions.

In FIG. 22, MACE terminal is supplied with a product-sum operation mode enable signal MACE indicating whether or not the product-sum operation mode is enabled, RST terminal is supplied with a reset signal RST, and YA terminal is supplied with a column address YA. D terminal is supplied with the input data D to be written to the product operation memory cell, and MEM terminal is supplied with the product-sum operation mask signal MEM for masking the product-sum operation. The data stored in the product operation memory cell is output from the Q terminal, and the product-sum operation output data (MQ output data) as a result of the product-sum operation is output from the MQ terminal.

Of course, the external terminals shown in FIG. 22 are only one example, and are not limited to this example.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a first product operation memory cell that is connected to a pair of data lines including first and second data lines, and stores a first logical value;
   a second product operation memory cell that is connected to the pair of data lines, and stores a second logical value;
   a first input line that is connected to the first product operation memory cell, and supplies the first product operation memory cell with first input data; and
   a second input line that is connected to the second product operation memory cell, and supplies the second product operation memory cell with second input data,
   wherein each of the first logical value and the second logical value is a ternary value,
   wherein the first product operation memory cell performs a first product operation of the first logical value and the first input data, and outputs a result of the first product operation to the pair of data lines,
   wherein the second product operation memory cell performs a second product operation of the second logical value and the second input data, and outputs a result of the second product operation to the pair of data lines, and
   wherein the results of the first product operation and the second product operation are superimposed to the pair of data lines.

2. The semiconductor device according to claim 1, further comprising:
   a first switch that is connected to the first data line and controlled by the first logical value;
   a second switch that is connected to the second data line and controlled by the second logical value; and
   a third switch that is controlled by an input value and connected to a voltage line,
   wherein the first data line is connected to the voltage line via the first switch and the third switch, corresponding to the first logical value, and
   wherein the second data line is connected to the voltage line via the second switch and the third switch, corresponding to the second logical value.

3. The semiconductor device according to claim 2,
   wherein the first data line and the second data line are formed in a first metal wiring layer, and
   wherein the voltage wiring is formed in a second metal wiring layer different from the first wiring layer.

4. The semiconductor device according to claim 3,
   wherein the first metal wiring layer and the second metal wiring layer are adjacent to each other, and
   wherein the first data line, the second data line, and the voltage line extend in a same direction.

5. A semiconductor device comprising:
   a plurality of product-sum operation memory cells each storing data of a ternary value; and
   a data line connected to the plurality of product-sum operation memory cells,
   wherein each of the plurality of product-sum operation memory cells performs a product-sum operation of input data input to the product-sum operation memory cell and stored data stored in the product-sum operation memory cell, wherein results of the product-sum operations by the plurality of product-sum operation memory cells are output to the data line,
wherein the product-sum operation memory cell output a voltage indicating a result of the product-sum operation, and
wherein each of the plurality of product-sum operation memory cell is comprised of:
   a first memory cell storing absolute value data; and
   a second memory cell storing sign data.

6. The semiconductor device according to claim 5,
wherein the data line is comprised of a first data line and a second data line,
wherein each of the plurality of product-sum operation memory cells is comprised of:
   a plurality of first switches controlled by the absolute value data stored in the plurality of first memory cells;
   a plurality of second switches controlled by the sign data stored in the second memory cells; and
   a plurality of third switches controlled by the input data,
wherein the first data line is connected to a voltage line via the first switch and the third switch, corresponding to the absolute value data and the input data,
wherein the second data line is connected to the voltage line via the second switch and the third switch, corresponding to the sign data and the input data,
wherein the absolute value data is weighted data, and
wherein a size of each of the plurality of first switches, the plurality of second switches, and the plurality of third switches corresponds to a weight of corresponding absolute value data.

7. A semiconductor device comprising:
a plurality of product-sum operation memory cells each storing data of a ternary value; and
a plurality of first data lines each connected to the plurality of product-sum operation memory cells,
wherein each of the plurality of product-sum operation memory cells performs a product-sum operation of stored data stored in the product-sum operation memory cell and input data input to the product-sum operation memory cell,
wherein the semiconductor device further comprises:
   a plurality of analog/digital conversion circuit that is connected to each of the plurality of first data lines, and converts an analog signal of connected first data line to a digital signal; and
   an input data holding circuit that holds a plurality of input data,
wherein data held in the input data holding circuit is supplied to the product-sum operation memory cells as the input data, and
wherein a result of the product-sum operation is supplied to the analog/digital conversion circuit via the first data line.

8. The semiconductor device according to claim 7, further comprising a plurality of second data lines,
wherein data is written to the plurality of product-sum operation memory cells via the plurality of second data lines.

9. The semiconductor device according to claim 7, further comprising:
a digital/analog conversion circuit connected to the input data holding circuit and converting the input data to an analog signal,
wherein the analog signal from the digital/analog conversion circuit is input to the product-sum operation memory cell.

10. The semiconductor device according to claim 7,
wherein each of the plurality of first data line is comprised of a pair of data lines,
wherein the semiconductor device further comprising:
   a reference cell connected to the pair of data lines and supplying a reference to one of the pair of data lines; and
   a comparator connected to the pair of data lines, and
wherein a potential difference between the pair of data lines is amplified by the comparator and data based on the amplified potential difference is output serially.

11. The semiconductor device according to claim 10,
wherein the reference cell comprises:
   a first reference cell having a driving force the same as a driving force of the product-sum operation memory cells; and
   a second reference cell having a driving force half of a driving force of the product-sum operation memory cells, and
wherein data based on the potential difference is output such that a sign bit is followed by a most significant bit to a least significant bit, serially.

12. The semiconductor device according to claim 11,
wherein the semiconductor device detects whether a result of the product-sum operation of the plurality of product-sum operation memory cells connected to the pair of data lines is "0", and
wherein, when the product-sum operation of the plurality of product-sum operation memory cells connected to the pair of data lines is "0", the semiconductor device outputs a predetermined logical value as the result of the product-sum operation.

13. The semiconductor device according to claim 11, wherein a length of the data output serially is variable.

14. The semiconductor device according to claim 10, further comprising:
a cell array in which the plurality of product-sum operation memory cells are arranged;
a reference array in which the reference cell is arranged; and
a source switch including a switch circuit and a bias circuit biasing the pair of data lines,
wherein the cell array, the reference array, and the source switch are distributed, and
wherein a part of the plurality of transistors constituting the product-sum operation memory cell and a part of transistors constituting the reference cell are used as transistors constituting the comparator.

15. The semiconductor device according to claim 14, further comprising:
a MACE terminal supplied with a product-sum operation mode enable signal indicating whether a product-sum mode performing the product-sum operation is enabled;
an RST terminal supplied with a reset signal;
a YA terminal supplied with an address specifying the product-sum operation memory cell of the cell array;
a D terminal supplied with a data written to the product-sum operation memory cell; and
a MQ terminal outputting a result of the product-sum operation.

16. The semiconductor device according to claim 10, wherein the reference cell comprises a terminal capable of changing its characteristics.

* * * * *